(12) United States Patent
Valentine et al.

(10) Patent No.: US 11,500,630 B2
(45) Date of Patent: *Nov. 15, 2022

(54) APPARATUS AND METHOD FOR CONVERTING A FLOATING-POINT VALUE FROM HALF PRECISION TO SINGLE PRECISION

(71) Applicant: Intel Corporation, Santa Clara, CA (US)

(72) Inventors: Robert Valentine, Kiryat Tivon (IL); Mark Charney, Lexington, MA (US); Raanan Sade, Kibutz Sarid (IL); Elmoustapha Ould-Ahmed-Vall, Chandler, AZ (US); Jesus Corbal, King City, OR (US)

(73) Assignee: Intel Corporation, Santa Clara, CA (US)

( * ) Notice: Subject to any disclaimer, the term of this patent is extended or adjusted under 35 U.S.C. 154(b) by 156 days.

This patent is subject to a terminal disclaimer.

(21) Appl. No.: 16/872,865

(22) Filed: May 12, 2020

(65) Prior Publication Data

US 2020/0341759 A1      Oct. 29, 2020

Related U.S. Application Data

(63) Continuation of application No. 15/824,339, filed on Nov. 28, 2017, now Pat. No. 10,684,854.

(51) Int. Cl.
*G06F 9/30* (2018.01)
*H03M 7/24* (2006.01)
*G06F 7/483* (2006.01)

(52) U.S. Cl.
CPC ........ *G06F 9/30014* (2013.01); *G06F 9/3013* (2013.01); *G06F 9/3016* (2013.01);
(Continued)

(58) Field of Classification Search
CPC .. G06F 9/30014; G06F 9/3013; G06F 9/3016; G06F 9/30025; G06F 9/30036; G06F 9/30109; G06F 7/483; H03M 7/24
(Continued)

(56) References Cited

U.S. PATENT DOCUMENTS

| 7,945,607 B2 * | 5/2011 | Hinds | H03M 7/24 |
| | | | 708/204 |
| 10,684,854 B2 * | 6/2020 | Valentine | G06F 9/3013 |

(Continued)

OTHER PUBLICATIONS

AMD64 Technology, "AMD64 Architecture Programmer's Manual", vol. 4:128-Bit and 256-Bit Media Instructions, Publication No. 26568, Revision 3.21, Dec. 2017, pp. 602-603.
(Continued)

*Primary Examiner* — Jacob Petranek
(74) *Attorney, Agent, or Firm* — Nicholson De Vos Webster & Elliott LLP

(57) ABSTRACT

An embodiment of the invention is a processor including execution circuitry to, in response to a decoded instruction, convert a half-precision floating-point value to a single-precision floating-point value and store the single-precision floating-point value in each of the plurality of element locations of a destination register. The processor also includes a decoder and the destination register. The decoder is to decode an instruction to generate the decoded instruction.

12 Claims, 17 Drawing Sheets

(52) U.S. Cl.
CPC .......... *G06F 7/483* (2013.01); *G06F 9/30025* (2013.01); *G06F 9/30036* (2013.01); *G06F 9/30109* (2013.01); *H03M 7/24* (2013.01)

(58) Field of Classification Search
USPC .......... 712/208–213, 221–224; 708/204, 495
See application file for complete search history.

(56) References Cited

U.S. PATENT DOCUMENTS

| | | | |
|---|---|---|---|
| 2004/0189651 A1 | 9/2004 | Zatz et al. | |
| 2006/0112160 A1* | 5/2006 | Ishii .................... | G06F 9/30014 708/495 |
| 2012/0124115 A1* | 5/2012 | Ollmann ................. | G06F 7/483 708/204 |
| 2016/0224514 A1* | 8/2016 | Moudgill ............ | G06F 15/8053 |

OTHER PUBLICATIONS

INterl, "Intel 64 and IA-32 Architectures Software Developer's Manual", Combined vols. 1, 2A, 2B, 2C, 2D, 3A, 3B, 3C, 3D and 4, Order No. 325462-063US, Jul. 2017, vol. 2A pp. 3-248-3-253.

Non-Final Office Action, U.S. Appl. No. 15/824,339, dated Apr. 22, 2019, 12 pages.

Notice of Allowance, U.S. Appl. No. 15/824,339, dated Feb. 25, 2020, 9 pages.

Notice of Allowance, U.S. Appl. No. 15/824,339, dated Sep. 11, 2019, 10 pages.

* cited by examiner

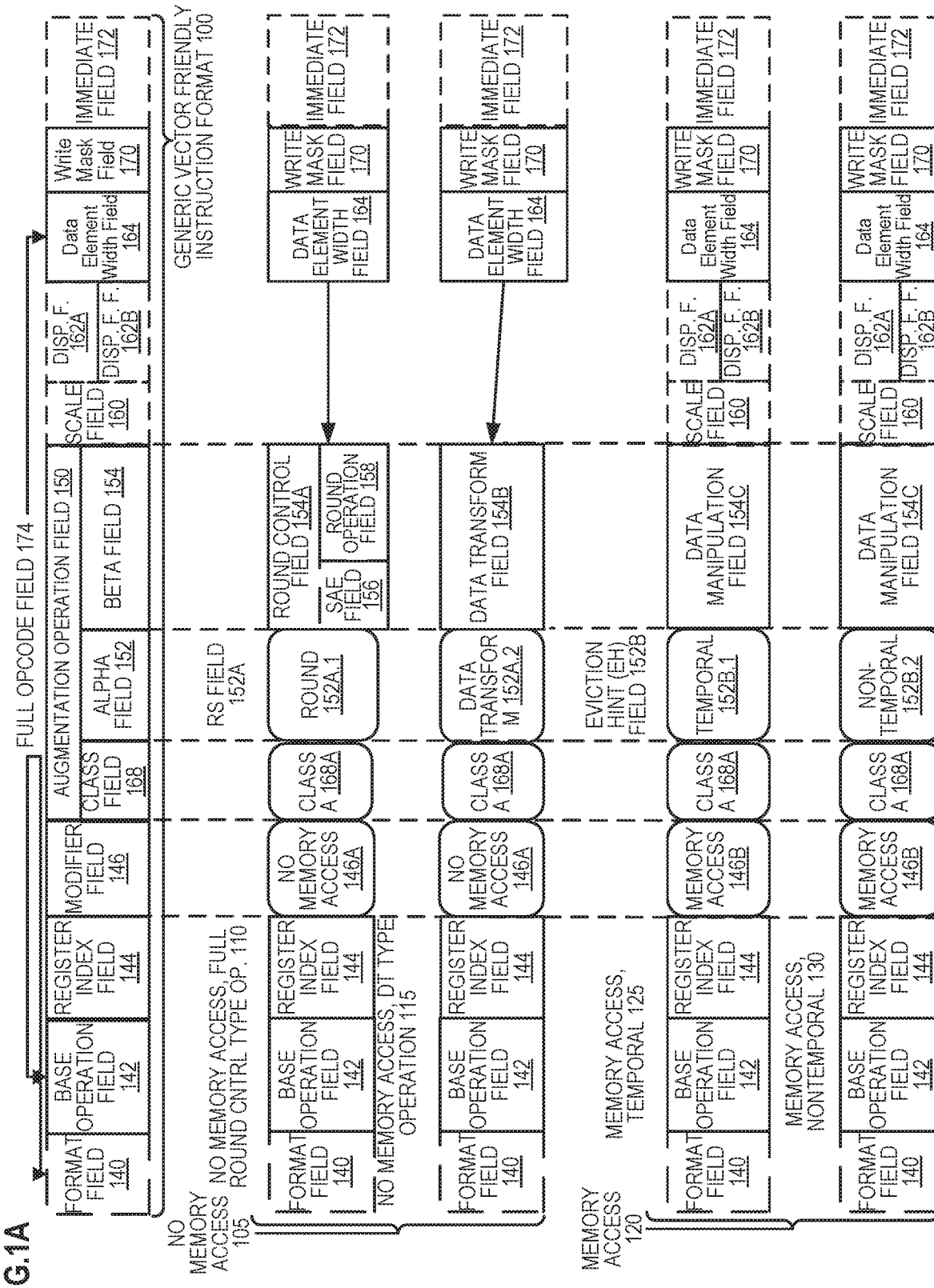

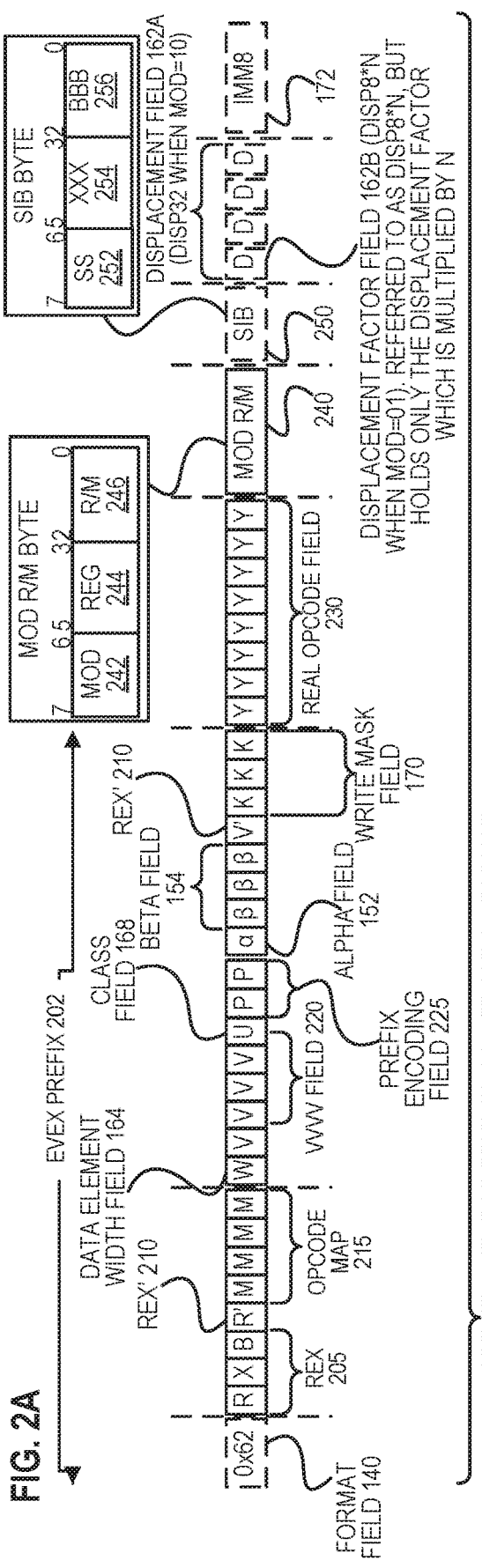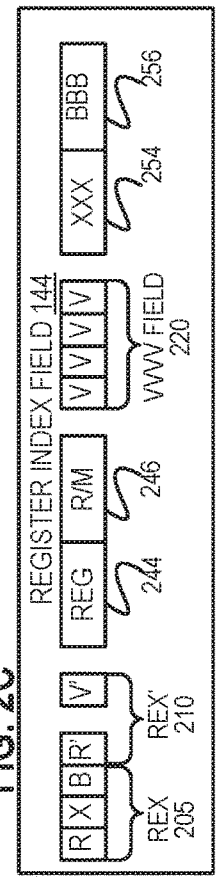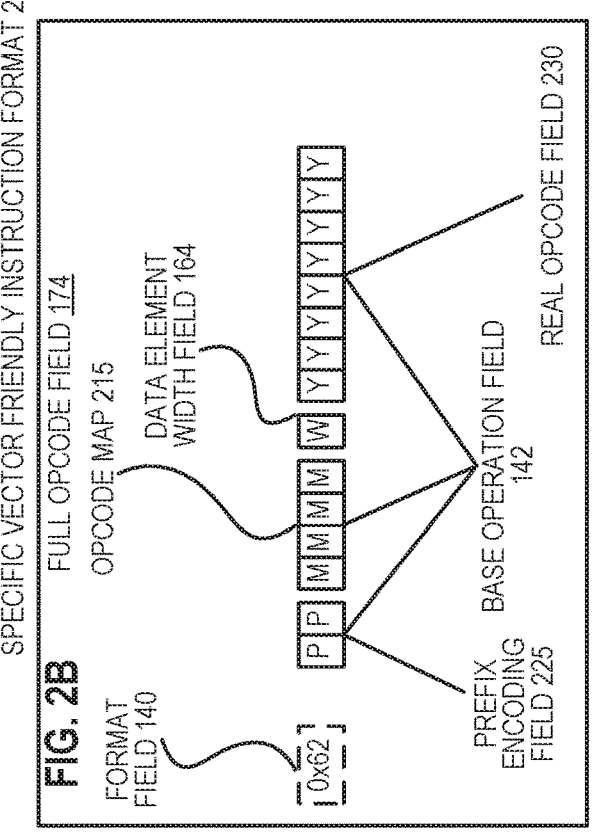

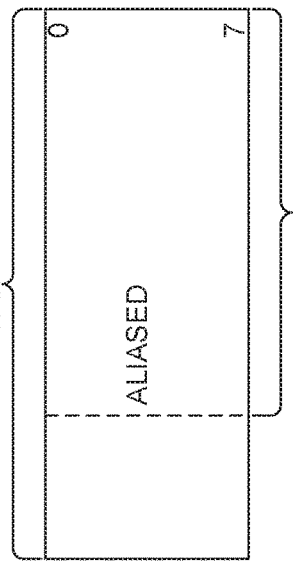
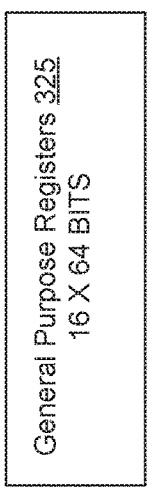
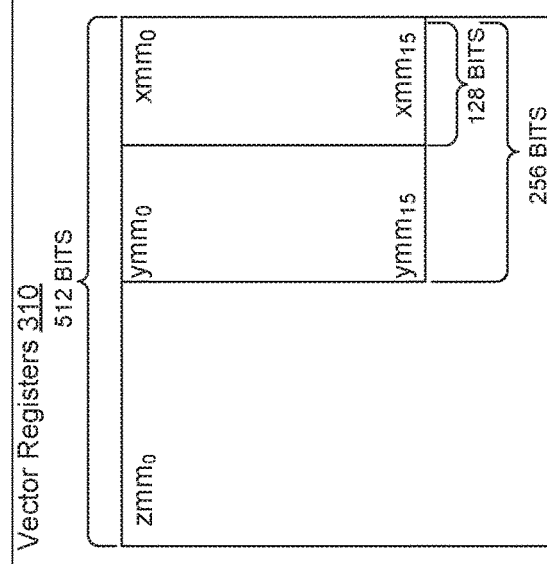
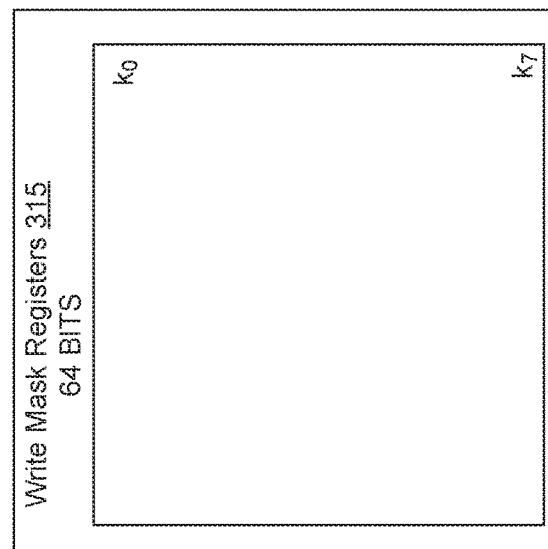
FIG. 3

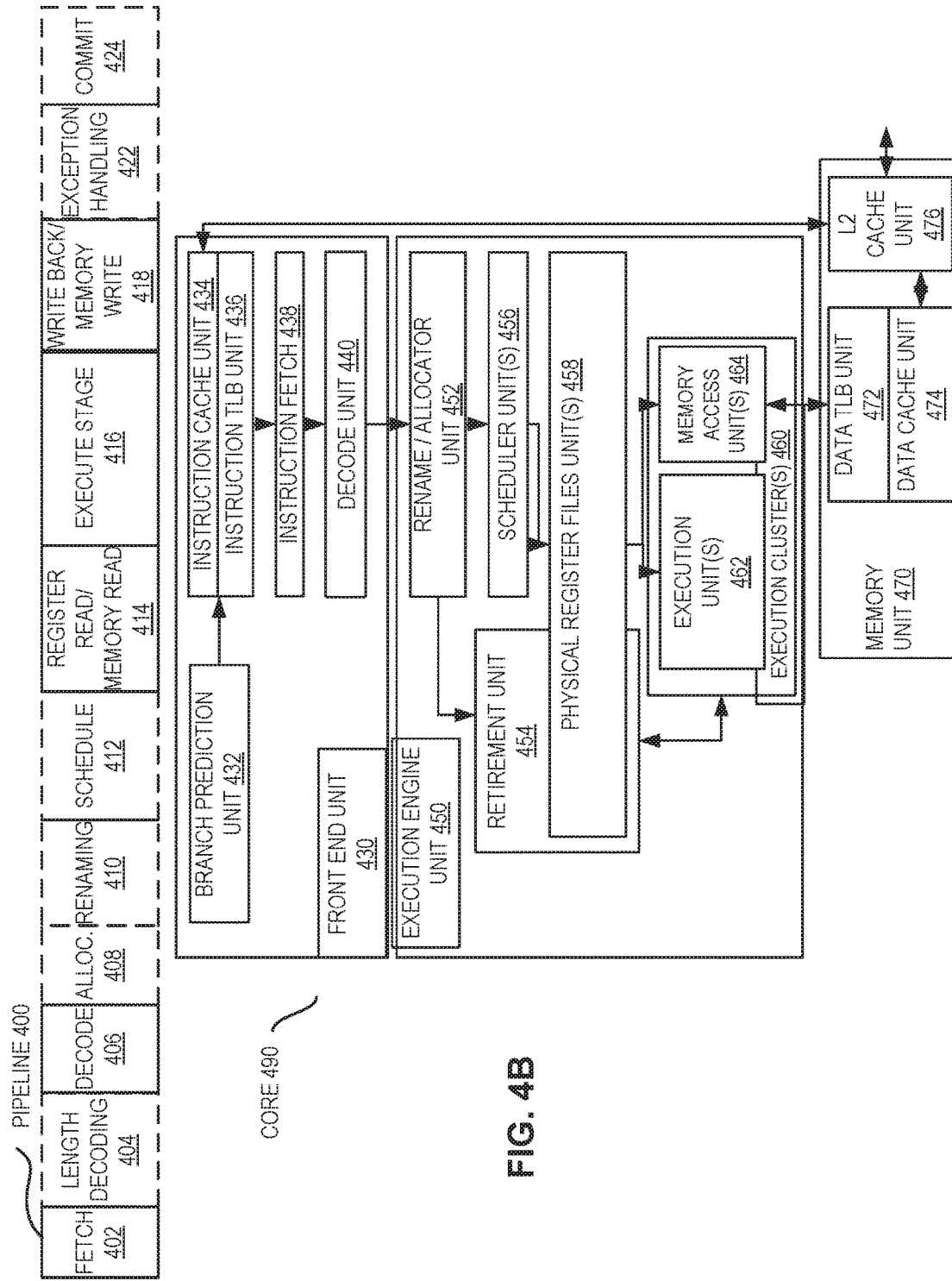

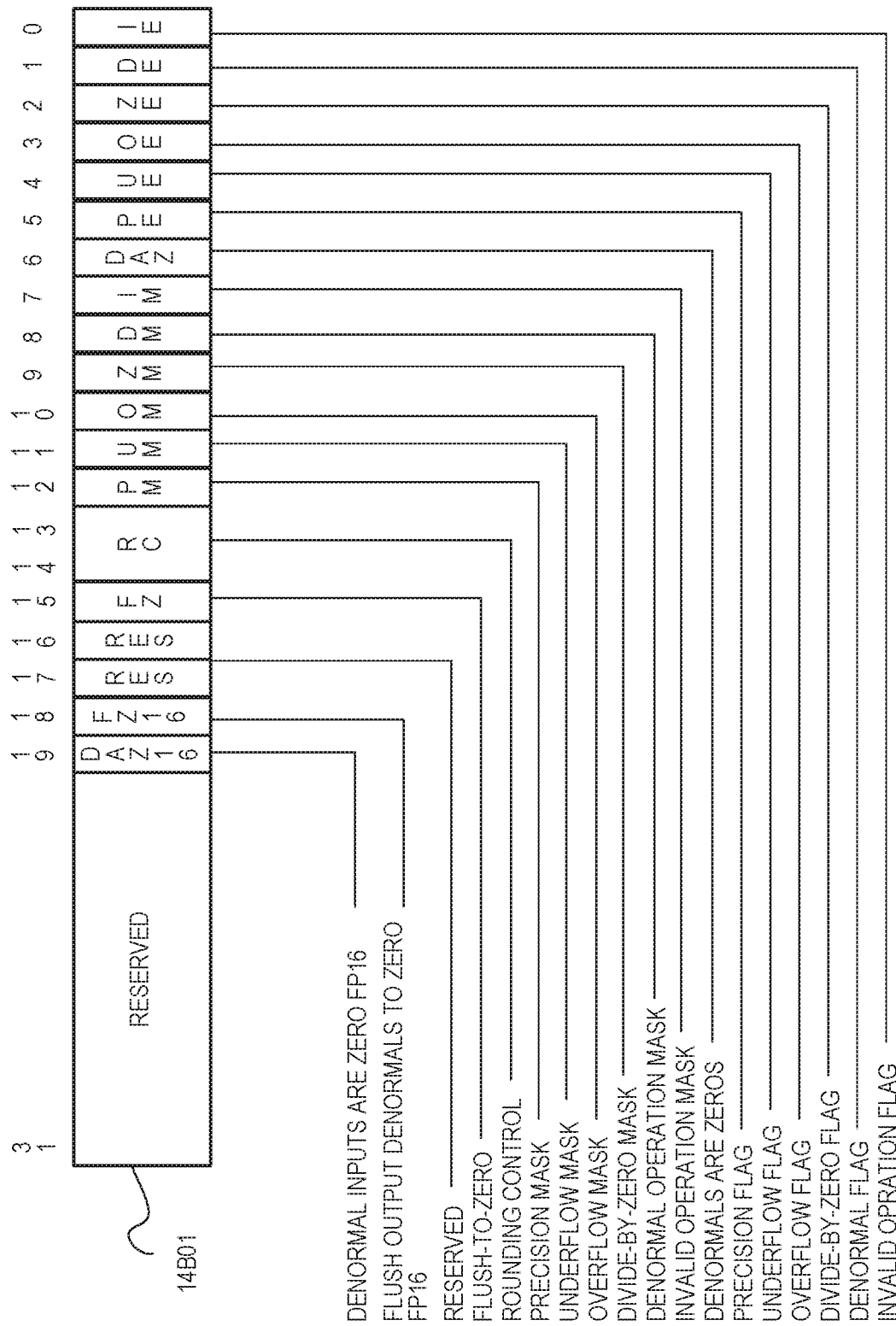

APPARATUS AND METHOD FOR CONVERTING A FLOATING-POINT VALUE FROM HALF PRECISION TO SINGLE PRECISION

FIELD OF THE INVENTION

Embodiments of the invention relate generally to the field of computer processors. More particularly, the embodiments relate to an apparatus and method for converting a floating-point value from half precision to single precision.

BACKGROUND

An instruction set, or instruction set architecture (ISA), is the part of the computer architecture related to programming, including the native data types, instructions, register architecture, addressing modes, memory architecture, interrupt and exception handling, and external input and output (I/O). It should be noted that the term "instruction" generally refers herein to macro-instructions—that is instructions that are provided to the processor for execution—as opposed to micro-instructions or micro-ops—that is the result of a processor's decoder decoding macro-instructions. The micro-instructions or micro-ops can be configured to instruct an execution unit on the processor to perform operations to implement the logic associated with the macro-instruction.

The ISA is distinguished from the microarchitecture, which is the set of processor design techniques used to implement the instruction set. Processors with different microarchitectures can share a common instruction set. For example, Intel® Pentium 4 processors, Intel® Core™ processors, and processors from Advanced Micro Devices, Inc. of Sunnyvale Calif. implement nearly identical versions of the x86 instruction set (with some extensions that have been added with newer versions), but have different internal designs. For example, the same register architecture of the ISA may be implemented in different ways in different microarchitectures using well-known techniques, including dedicated physical registers, one or more dynamically allocated physical registers using a register renaming mechanism (e.g., the use of a Register Alias Table (RAT), a Reorder Buffer (ROB) and a retirement register file). Unless otherwise specified, the phrases register architecture, register file, and register are used herein to refer to that which is visible to the software/programmer and the manner in which instructions specify registers. Where a distinction is required, the adjective "logical," "architectural," or "software visible" will be used to indicate registers/files in the register architecture, while different adjectives will be used to designate registers in a given microarchitecture (e.g., physical register, reorder buffer, retirement register, register pool).

BRIEF DESCRIPTION OF THE DRAWINGS

The present invention is illustrated by way of example and not limitation in the figures of the accompanying drawings, in which like references indicate similar elements and in which:

FIGS. 1A-1B are block diagrams illustrating a generic vector friendly instruction format and instruction templates thereof according to embodiments of the invention;

FIG. 1A is a block diagram illustrating a generic vector friendly instruction format and class A instruction templates thereof according to embodiments of the invention;

FIG. 1B is a block diagram illustrating the generic vector friendly instruction format and class B instruction templates thereof according to embodiments of the invention;

FIG. 2A is a block diagram illustrating an exemplary specific vector friendly instruction format according to embodiments of the invention;

FIG. 2B is a block diagram illustrating the fields of the specific vector friendly instruction format 200 that make up the full opcode field 174 according to one embodiment of the invention;

FIG. 2C is a block diagram illustrating the fields of the specific vector friendly instruction format 200 that make up the register index field 144 according to one embodiment of the invention;

FIG. 3 is a block diagram of a register architecture 300 according to one embodiment of the invention;

FIG. 4A is a block diagram illustrating both an exemplary in-order pipeline and an exemplary register renaming, out-of-order issue/execution pipeline according to embodiments of the invention;

FIG. 4B is a block diagram illustrating both an exemplary embodiment of an in-order architecture core and an exemplary register renaming, out-of-order issue/execution architecture core to be included in a processor according to embodiments of the invention;

FIG. 5A is a block diagram of a single processor core, along with its connection to the on-die interconnect network 502 and with its local subset of the Level 2 (L2) cache 504, according to embodiments of the invention;

FIG. 5B is an expanded view of part of the processor core in FIG. 5A according to embodiments of the invention;

FIG. 7 shown a block diagram of a system in accordance with one embodiment of the present invention;

FIG. 8 is a block diagram of a first more specific exemplary system in accordance with an embodiment of the present invention;

FIG. 9 is a block diagram of a second more specific exemplary system in accordance with an embodiment of the present invention;

FIG. 10 is a block diagram of a SoC in accordance with an embodiment of the present invention;

FIGS. 14A and 14B illustrate embodiments of an FP16 control and status register having fields related to half-precision floating-point usage for an instruction.

DETAILED DESCRIPTION

Figure 1B:
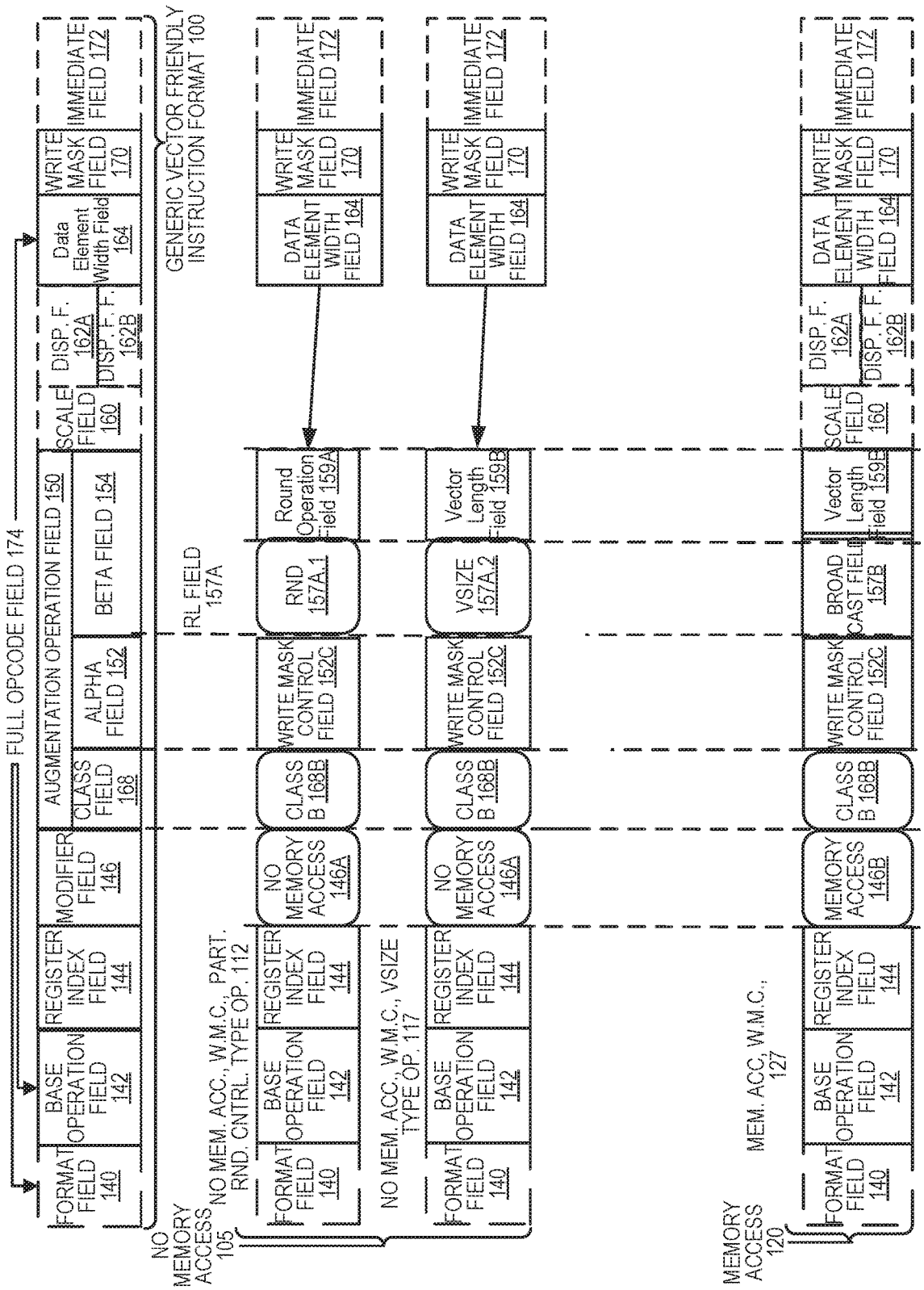

In the following description, numerous specific details are set forth. However, it is understood that embodiments of the invention may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used in this description and the claims and unless otherwise specified, the use of the ordinal adjectives "first," "second," "third," etc. to describe an element merely indicate that a particular instance of an element or different instances of like elements are being referred to, and is not intended to imply that the elements so described must be in a particular sequence, either temporally, spatially, in ranking, or in any other manner.

Instructions to be executed by a processor core according to embodiments of the invention may be embodied in a "generic vector friendly instruction format" which is detailed below. In other embodiments, such a format is not utilized and another instruction format is used, however, the description below of the write-mask registers, various data transformations (swizzle, broadcast, etc.), addressing, etc. is generally applicable to the description of the embodiments of the instruction(s) above. Additionally, exemplary systems, architectures, and pipelines are detailed below. Instructions may be executed on such systems, architectures, and pipelines, but are not limited to those detailed.

Instruction Sets

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX, AVX2, and AVX-512) and using the Vector Extensions (VEX) coding scheme has been released and/or published (e.g., see Intel® 64 and IA-32 Architectures Software Developer's Manual, September 2014; Intel® Advanced Vector Extensions Programming Reference, October 2014; and Intel® Architecture Instruction Set Extensions Programming Reference, October 2016).

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

FIGS. 1A-1B are block diagrams illustrating a generic vector friendly instruction format and instruction templates thereof according to embodiments of the invention. FIG. 1A is a block diagram illustrating a generic vector friendly instruction format and class A instruction templates thereof according to embodiments of the invention; while FIG. 1B is a block diagram illustrating the generic vector friendly instruction format and class B instruction templates thereof according to embodiments of the invention. Specifically, a generic vector friendly instruction format 100 for which are defined class A and class B instruction templates, both of which include no memory access 105 instruction templates and memory access 120 instruction templates. The term generic in the context of the vector friendly instruction format refers to the instruction format not being tied to any specific instruction set.

While embodiments of the invention will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 1A include: 1) within the no memory access 105 instruction templates there is shown a no memory access, full round control type operation 110 instruction template and a no memory access, data transform type operation 115 instruction template; and 2) within the memory access 120 instruction templates there is shown a memory access, temporal 125 instruction template and a memory access, non-temporal 130 instruction template. The class B instruction templates in FIG. 1B include: 1) within the no memory access 105 instruction templates there is shown a no memory access, write mask control, partial round control type operation 112 instruction template and a no memory access, write mask control, vsize type operation 117 instruction template; and 2) within the memory access 120 instruction templates there is shown a memory access, write mask control 127 instruction template.

The generic vector friendly instruction format 100 includes the following fields listed below in the order illustrated in FIGS. 1A-1B.

Format field 140—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 142—its content distinguishes different base operations.

Register index field 144—its content, directly or through address generation, specifies the locations of the source and destination operands, be they in registers or in memory. These include a sufficient number of bits to select N registers from a P×Q (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 146—its content distinguishes occurrences of instructions in the generic vector instruction format that specify memory access from those that do not; that is, between no memory access 105 instruction templates and memory access 120 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 150—its content distinguishes which one of a variety of different operations to be performed in addition to the base operation. This field is context specific. In one embodiment of the invention, this field is divided into a class field 168, an alpha field 152, and a beta field 154. The augmentation operation field 150 allows common groups of operations to be performed in a single instruction rather than 2, 3, or 4 instructions.

Scale field 160—its content allows for the scaling of the index field's content for memory address generation (e.g., for address generation that uses 2scale*index+base).

Displacement Field 162A—its content is used as part of memory address generation (e.g., for address generation that uses 2scale*index+base+displacement).

Displacement Factor Field 162B (note that the juxtaposition of displacement field 162A directly over displacement factor field 162B indicates one or the other is used)—its content is used as part of address generation; it specifies a displacement factor that is to be scaled by the size of a memory access (N)—where N is the number of bytes in the memory access (e.g., for address generation that uses 2scale*index+base+scaled displacement). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 174 (described later herein) and the data manipulation field 154C. The displacement field 162A and the displacement factor field 162B are optional in the sense that they are not used for the no memory access 105 instruction templates and/or different embodiments may implement only one or none of the two.

Data element width field 164—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 170—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 170 allows for partial vector operations, including loads, stores, arithmetic, logical, etc. While embodiments of the invention are described in which the write mask field's 170 content selects one of a number of write mask registers that contains the write mask to be used (and thus the write mask field's 170 content indirectly identifies that masking to be performed), alternative embodiments instead or additional allow the mask write field's 170 content to directly specify the masking to be performed.

Immediate field 172—its content allows for the specification of an immediate. This field is optional in the sense that is it not present in an implementation of the generic vector friendly format that does not support immediate and it is not present in instructions that do not use an immediate.

Class field 168—its content distinguishes between different classes of instructions. With reference to FIGS. 1A-B, the contents of this field select between class A and class B instructions. In FIGS. 1A-B, rounded corner squares are used to indicate a specific value is present in a field (e.g., class A 168A and class B 168B for the class field 168 respectively in FIGS. 1A-B).

Instruction Templates of Class A

In the case of the non-memory access 105 instruction templates of class A, the alpha field 152 is interpreted as an RS field 152A, whose content distinguishes which one of the different augmentation operation types are to be performed (e.g., round 152A.1 and data transform 152A.2 are respectively specified for the no memory access, round type operation 110 and the no memory access, data transform type operation 115 instruction templates), while the beta field 154 distinguishes which of the operations of the specified type is to be performed. In the no memory access 105 instruction templates, the scale field 160, the displacement field 162A, and the displacement scale filed 162B are not present.

No-Memory Access Instruction Templates—Full Round Control Type Operation

In the no memory access full round control type operation 110 instruction template, the beta field 154 is interpreted as a round control field 154A, whose content(s) provide static rounding. While in the described embodiments of the invention the round control field 154A includes a suppress all floating-point exceptions (SAE) field 156 and a round operation control field 158, alternative embodiments may support may encode both these concepts into the same field or only have one or the other of these concepts/fields (e.g., may have only the round operation control field 158).

SAE field 156—its content distinguishes whether or not to disable the exception event reporting; when the SAE field's 156 content indicates suppression is enabled, a given instruction does not report any kind of floating-point exception flag and does not raise any floating-point exception handler.

Round operation control field 158—its content distinguishes which one of a group of rounding operations to perform (e.g., Round-up, Round-down, Round-towards-zero and Round-to-nearest). Thus, the round operation control field 158 allows for the changing of the rounding mode on a per instruction basis. In one embodiment of the invention where a processor includes a control register for specifying rounding modes, the round operation control field's 150 content overrides that register value.

No Memory Access Instruction Templates—Data Transform Type Operation

In the no memory access data transform type operation 115 instruction template, the beta field 154 is interpreted as a data transform field 154B, whose content distinguishes which one of a number of data transforms is to be performed (e.g., no data transform, swizzle, broadcast).

In the case of a memory access 120 instruction template of class A, the alpha field 152 is interpreted as an eviction hint field 152B, whose content distinguishes which one of the eviction hints is to be used (in FIG. 1A, temporal 152B.1 and non-temporal 152B.2 are respectively specified for the memory access, temporal 125 instruction template and the memory access, non-temporal 130 instruction template), while the beta field 154 is interpreted as a data manipulation field 154C, whose content distinguishes which one of a number of data manipulation operations (also known as primitives) is to be performed (e.g., no manipulation; broadcast; up conversion of a source; and down conversion of a destination). The memory access 120 instruction templates include the scale field 160, and optionally the displacement field 162A or the displacement scale field 162B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 152 is interpreted as a write mask control (Z) field 152C, whose content distinguishes whether the write masking controlled by the write mask field 170 should be a merging or a zeroing.

In the case of the non-memory access 105 instruction templates of class B, part of the beta field 154 is interpreted as an RL field 157A, whose content distinguishes which one of the different augmentation operation types are to be performed (e.g., round 157A.1 and vector length (VSIZE) 157A.2 are respectively specified for the no memory access, write mask control, partial round control type operation 112 instruction template and the no memory access, write mask control, VSIZE type operation 117 instruction template), while the rest of the beta field 154 distinguishes which of the operations of the specified type is to be performed. In the no memory access 105 instruction templates, the scale field 160, the displacement field 162A, and the displacement scale filed 162B are not present.

In the no memory access, write mask control, partial round control type operation 110 instruction template, the rest of the beta field 154 is interpreted as a round operation field 159A and exception event reporting is disabled (a given instruction does not report any kind of floating-point exception flag and does not raise any floating-point exception handler).

Round operation control field 159A—just as round operation control field 158, its content distinguishes which one of a group of rounding operations to perform (e.g., Round-up, Round-down, Round-towards-zero and Round-to-nearest). Thus, the round operation control field 159A allows for the changing of the rounding mode on a per instruction basis. In one embodiment of the invention where a processor includes a control register for specifying rounding modes, the round operation control field's 150 content overrides that register value.

In the no memory access, write mask control, VSIZE type operation 117 instruction template, the rest of the beta field 154 is interpreted as a vector length field 159B, whose content distinguishes which one of a number of data vector lengths is to be performed on (e.g., 128, 256, or 512 byte).

In the case of a memory access 120 instruction template of class B, part of the beta field 154 is interpreted as a broadcast field 157B, whose content distinguishes whether or not the broadcast type data manipulation operation is to be performed, while the rest of the beta field 154 is interpreted the vector length field 159B. The memory access 120 instruction templates include the scale field 160, and optionally the displacement field 162A or the displacement scale field 162B.

With regard to the generic vector friendly instruction format 100, a full opcode field 174 is shown including the format field 140, the base operation field 142, and the data element width field 164. While one embodiment is shown where the full opcode field 174 includes all of these fields, the full opcode field 174 includes less than all of these fields in embodiments that do not support all of them. The full opcode field 174 provides the operation code (opcode).

The augmentation operation field 150, the data element width field 164, and the write mask field 170 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the invention, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general-purpose cores, one of the graphics cores intended primarily for graphics and/or scientific computing may support only class A, while one or more of the general-purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the invention. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Exemplary Specific Vector Friendly Instruction Format

FIG. 2A is a block diagram illustrating an exemplary specific vector friendly instruction format according to embodiments of the invention. FIG. 2A shows a specific vector friendly instruction format 200 that is specific in the sense that it specifies the location, size, interpretation, and order of the fields, as well as values for some of those fields. The specific vector friendly instruction format 200 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 1B into which the fields from FIG. 2A map are illustrated.

It should be understood that, although embodiments of the invention are described with reference to the specific vector friendly instruction format 200 in the context of the generic vector friendly instruction format 100 for illustrative purposes, the invention is not limited to the specific vector friendly instruction format 200 except where claimed. For example, the generic vector friendly instruction format 100 contemplates a variety of possible sizes for the various fields, while the specific vector friendly instruction format 200 is shown as having fields of specific sizes. By way of specific example, while the data element width field 164 is illustrated as a one-bit field in the specific vector friendly instruction format 200, the invention is not so limited (that is, the generic vector friendly instruction format 100 contemplates other sizes of the data element width field 164).

The generic vector friendly instruction format 100 includes the following fields listed below in the order illustrated in FIG. 2A.

EVEX Prefix (Bytes 0-3) 202—is encoded in a four-byte form.

Format Field 140 (EVEX Byte 0, bits [7:0])—the first byte (EVEX Byte 0) is the format field 140 and it contains 0x62 (the unique value used for distinguishing the vector friendly instruction format in one embodiment of the invention).

The second-fourth bytes (EVEX Bytes 1-3) include a number of bit fields providing specific capability.

REX field 205 (EVEX Byte 1, bits [7-5])—consists of a EVEX.R bit field (EVEX Byte 1, bit [7]—R), EVEX.X bit field (EVEX byte 1, bit [6]—X), and 157BEX byte 1, bit[5]—B). The EVEX.R, EVEX.X, and EVEX.B bit fields provide the same functionality as the corresponding VEX bit fields, and are encoded using is complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 110—this is the first part of the REX' field 110 and is the EVEX.R' bit field (EVEX Byte 1, bit [4]—R') that is used to encode either the upper 16 or lower 16 of the extended 32 register set. In one embodiment of the invention, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the invention do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 215 (EVEX byte 1, bits [3:0]—mmmm)—its content encodes an implied leading opcode byte (0F, 0F 38, or 0F 3).

Data element width field 164 (EVEX byte 2, bit [7]—W)—is represented by the notation EVEX.W. EVEX.W is used to define the granularity (size) of the datatype (either 32-bit data elements or 64-bit data elements).

EVEX.vvvv 220 (EVEX Byte 2, bits [6:3]—vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in is complement form for certain vector shifts; or 3) EVEX.vvvv does not encode any operand, the field is reserved and should contain 1111b. Thus, EVEX.vvvv field 220 encodes the 4 low-order bits of the first source register specifier stored in inverted (1s complement) form. Depending on the instruction, an extra different EVEX bit field is used to extend the specifier size to 32 registers.

EVEX.U 168 Class field (EVEX byte 2, bit [2]—U)—If EVEX.0=0, it indicates class A or EVEX.U0; if EVEX.0=1, it indicates class B or EVEX.U1.

Prefix encoding field 225 (EVEX byte 2, bits [1:0]—pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2-bit SIMD prefix encodings, and thus not require the expansion.

Alpha field 152 (EVEX byte 3, bit [7]—EH; also known as EVEX.EH, EVEX.rs, EVEX.RL, EVEX.write mask control, and EVEX.N; also illustrated with α)—as previously described, this field is context specific.

Beta field 154 (EVEX byte 3, bits [6:4]—SSS, also known as EVEX.s2-0, EVEX.r2-0, EVEX.rr1, EVEX.LL0, EVEX.LLB; also illustrated with βββ)—as previously described, this field is context specific.

REX' field 110—this is the remainder of the REX' field and is the EVEX.V' bit field (EVEX Byte 3, bit [3]—V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 170 (EVEX byte 3, bits [2:0]—kkk)—its content specifies the index of a register in the write mask registers as previously described. In one embodiment of the invention, the specific value EVEX.kkk=000 has a special behavior implying no write mask is used for the particular instruction (this may be implemented in a variety of ways including the use of a write mask hardwired to all ones or hardware that bypasses the masking hardware).

Real Opcode Field 230 (Byte 4) is also known as the opcode byte. Part of the opcode is specified in this field.

MOD R/M Field 240 (Byte 5) includes MOD field 242, Reg field 244, and R/M field 246. As previously described, the MOD field's 242 content distinguishes between memory access and non-memory access operations. The role of Reg field 244 can be summarized to two situations: encoding either the destination register operand or a source register operand, or be treated as an opcode extension and not used to encode any instruction operand. The role of R/M field 246 may include the following: encoding the instruction operand that references a memory address, or encoding either the destination register operand or a source register operand.

Scale, Index, Base (SIB) Byte (Byte 6)—As previously described, the scale field's 150 content is used for memory address generation. SIB.xxx 254 and SIB.bbb 256—the contents of these fields have been previously referred to with regard to the register indexes Xxxx and Bbbb.

Displacement field 162A (Bytes 7-10)—when MOD field 242 contains 10, bytes 7-10 are the displacement field 162A, and it works the same as the legacy 32-bit displacement (disp32) and works at byte granularity.

Displacement factor field 162B (Byte 7)—when MOD field 242 contains 01, byte 7 is the displacement factor field 162B. The location of this field is that same as that of the legacy x86 instruction set 8-bit displacement (disp8), which works at byte granularity. Since disp8 is sign extended, it can only address between −128 and 127 bytes offsets; in terms of 64-byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 162B is a reinterpretation of disp8; when using displacement factor field 162B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 162B substitutes the legacy x86 instruction set 8-bit displacement. Thus, the displacement factor field 162B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset). Immediate field 172 operates as previously described.

Full Opcode Field

FIG. 2B is a block diagram illustrating the fields of the specific vector friendly instruction format 200 that make up the full opcode field 174 according to one embodiment of the invention. Specifically, the full opcode field 174 includes the format field 140, the base operation field 142, and the data element width (W) field 164. The base operation field 142 includes the prefix encoding field 225, the opcode map field 215, and the real opcode field 230.

Register Index Field

FIG. 2C is a block diagram illustrating the fields of the specific vector friendly instruction format 200 that make up the register index field 144 according to one embodiment of the invention. Specifically, the register index field 144 includes the REX field 205, the REX' field 210, the MODR/M.reg field 244, the MODR/M.r/m field 246, the VVVV field 220, xxx field 254, and the bbb field 256.

Augmentation Operation Field

Figure 2D:
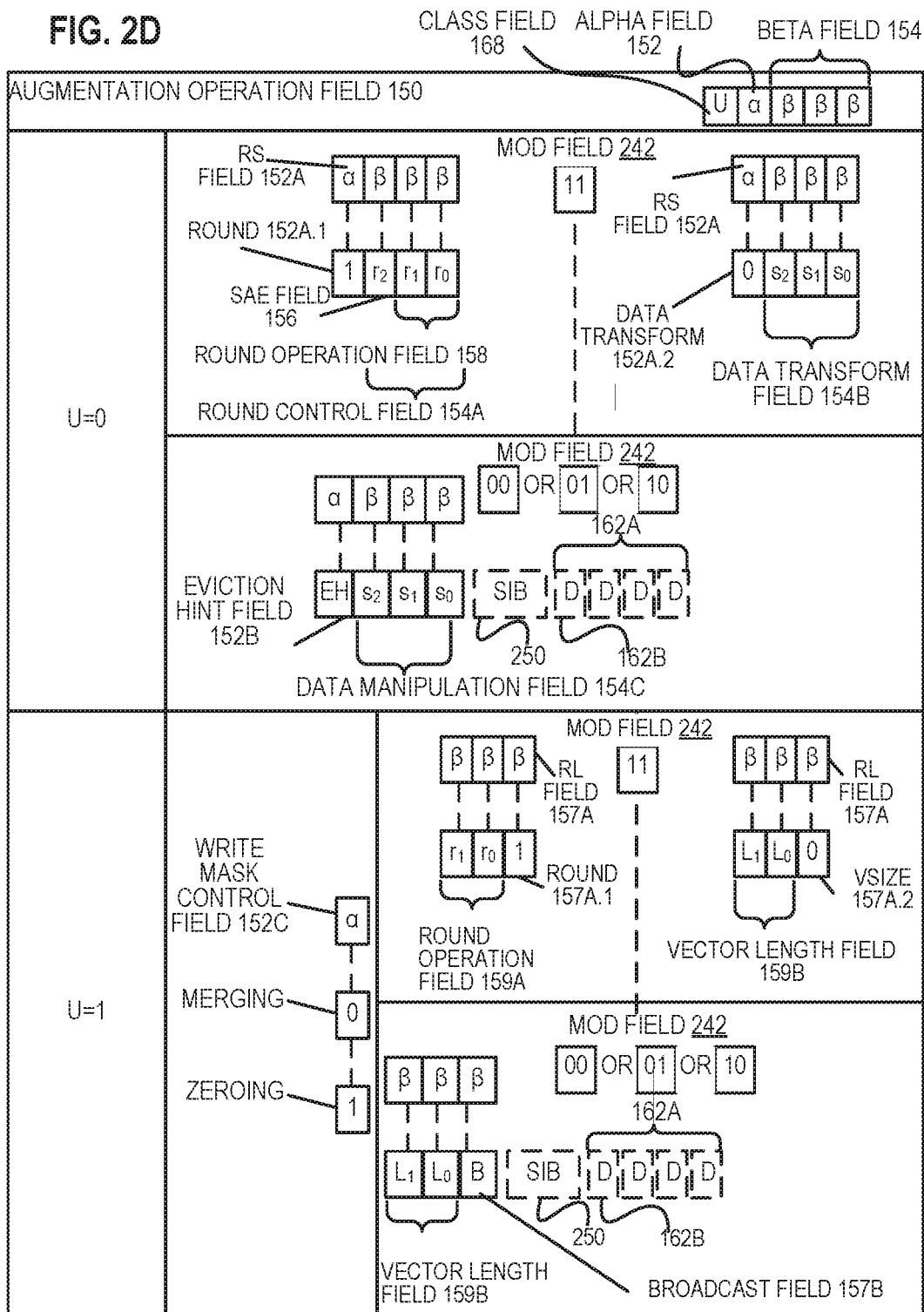
FIG. 2D is a block diagram illustrating the fields of the specific vector friendly instruction format 200 that make up the augmentation operation field 150 according to one embodiment of the invention.

FIG. 2D is a block diagram illustrating the fields of the specific vector friendly instruction format 200 that make up the augmentation operation field 150 according to one embodiment of the invention. When the class (U) field 168 contains 0, it signifies EVEX.U0 (class A 168A); when it contains 1, it signifies EVEX.U1 (class B 168B). When U=0 and the MOD field 242 contains 11 (signifying a no memory access operation), the alpha field 152 (EVEX byte 3, bit [7]—EH) is interpreted as the rs field 152A. When the rs field 152A contains a 1 (round 152A.1), the beta field 154 (EVEX byte 3, bits [6:4]—SSS) is interpreted as the round control field 154A. The round control field 154A includes a one-bit SAE field 156 and a two-bit round operation field 158. When the rs field 152A contains a 0 (data transform 152A.2), the beta field 154 (EVEX byte 3, bits [6:4]—SSS) is interpreted as a three-bit data transform field 154B. When U=0 and the MOD field 242 contains 00, 01, or 10 (signifying a memory access operation), the alpha field 152 (EVEX byte 3, bit [7]—EH) is interpreted as the eviction hint (EH) field 152B and the beta field 154 (EVEX byte 3, bits [6:4]—SSS) is interpreted as a three-bit data manipulation field 154C.

When U=1, the alpha field 152 (EVEX byte 3, bit [7]—EH) is interpreted as the write mask control (Z) field 152C. When U=1 and the MOD field 242 contains 11 (signifying a no memory access operation), part of the beta field 154 (EVEX byte 3, bit [4]—SO) is interpreted as the RL field 157A; when it contains a 1 (round 157A.1) the rest of the beta field 154 (EVEX byte 3, bit [6-5]—S2-1) is interpreted as the round operation field 159A, while when the RL field 157A contains a 0 (VSIZE 157.A2) the rest of the beta field 154 (EVEX byte 3, bit [6-5]—S2-1) is interpreted as the vector length field 159B (EVEX byte 3, bit [6-5]—L1-0). When U=1 and the MOD field 242 contains 00, 01, or 10 (signifying a memory access operation), the beta field 154 (EVEX byte 3, bits [6:4]—SSS) is interpreted as the vector length field 159B (EVEX byte 3, bit [6-5]—L1-0) and the broadcast field 157B (EVEX byte 3, bit [4]—B).

Exemplary Register Architecture

FIG. 3 is a block diagram of a register architecture 300 according to one embodiment of the invention. In the embodiment illustrated, there are 32 vector registers 310 that are 512 bits wide; these registers are referenced as zmm0 through zmm31 (the zmm register set). Other embodiments may include, instead of the zmm register set, a set of sixteen vector registers that are 256 bits wide; these registers are referenced as ymm0 through ymm15 (the ymm register set). Other embodiments may include, instead of the zmm register set or ymm register set, a set of sixteen vector registers that are 128 bits wide; these registers are references as xmm0 through xmm15 (the xmm register set). In FIG. 3, the lower order 256 bits of the lower 16 zmm registers are overlaid on registers ymm0-15, and the lower order 128 bits of the lower 16 zmm registers (the lower order 128 bits of the ymm registers) are overlaid on registers xmm0-15.

The specific vector friendly instruction format 200 operates on these overlaid register file as illustrated in the below table.

| Adjustable Vector Length | Class | Operations | Registers |
|---|---|---|---|
| Instruction Templates that do not include the vector length field 159B | A (FIG. 1A; U = 0) | 110, 115, 125, 130 | zmm registers (the vector length is 64 byte) |
| | B (FIG. 1B; U = 1) | 112 | zmm registers (the vector length is 64 byte) |
| Instruction templates that do include the vector length field 159B | B (FIG. 1B; U = 1) | 117, 127 | zmm, ymm, or xmm registers (the vector length is 64-byte, 32-byte, or 16-byte) depending on the vector length field 159B |

In other words, the vector length field 159B selects between a maximum length and one or more other shorter lengths, where each such shorter length is half the length of the preceding length; and instructions templates without the vector length field 159B operate on the maximum vector length. Further, in one embodiment, the class B instruction templates of the specific vector friendly instruction format 200 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 315—in the embodiment illustrated, there are 8 write mask registers (k0 through k7), each 64 bits in size. In an alternate embodiment, the write mask registers 315 are 16 bits in size. In one embodiment, the vector mask register k0 cannot be used as a write mask; when the encoding that would normally indicate k0 is used for a write mask, it selects a hardwired write mask of 0xFFFF, effectively disabling write masking for that instruction.

General-purpose registers 325—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 345, on which is aliased the MMX packed integer flat register file 350—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores in which the invention may be embodied may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a central processing unit (CPU) including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput) computing. Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip (SoC) that may include on the same die the described CPU (sometimes referred to as the application core(s) or application processor(s)), the above described coprocessor, and additional functionality.

Exemplary Core Architectures
In-Order and Out-of-Order Core Block Diagram

FIG. 4A is a block diagram illustrating both an exemplary in-order pipeline and an exemplary register renaming, out-of-order issue/execution pipeline according to embodiments of the invention. FIG. 4B is a block diagram illustrating both an exemplary embodiment of an in-order architecture core and an exemplary register renaming, out-of-order issue/execution architecture core to be included in a processor according to embodiments of the invention. The solid lined boxes in FIGS. 4A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 4A, a processor pipeline 400 includes a fetch stage 402, a length decode stage 404, a decode stage 406, an allocation stage 408, a renaming stage 410, a scheduling (also known as a dispatch or issue) stage 412, a register read/memory read stage 414, an execute stage 416, a write back/memory write stage 418, an exception handling stage 422, and a commit stage 424.

FIG. 4B shows processor core 490 including a front-end unit 430 coupled to an execution engine unit 450, and both are coupled to a memory unit 470. The core 490 may be a reduced instruction set computing (RISC) core, a complex instruction set computing (CISC) core, a very long instruction word (VLIW) core, or a hybrid or alternative core type. As yet another option, the core 490 may be a special-purpose core, such as, for example, a network or communication core, compression engine, coprocessor core, general purpose computing graphics processing unit (GPGPU) core, graphics core, or the like.

The front-end unit 430 includes a branch prediction unit 432 coupled to a micro-op cache 433 and an instruction cache unit 434, which is coupled to an instruction translation lookaside buffer (TLB) 436, which is coupled to an instruction fetch unit 438, which is coupled to a decode unit 440. The decode unit 440 (or decoder) may decode instructions, and generate as an output one or more micro-operations, micro-code entry points, microinstructions, other instructions, or other control signals, which are decoded from, or which otherwise reflect, or are derived from, the original instructions. The decode unit 440 may be implemented using various different mechanisms. Examples of suitable mechanisms include, but are not limited to, look-up tables, hardware implementations, programmable logic arrays (PLAs), microcode read only memories (ROMs), etc. In one embodiment, the core 490 includes a microcode ROM or other medium that stores microcode for certain macroinstructions (e.g., in decode unit 440 or otherwise within the front-end unit 430). The micro-op cache 433 and the decode unit 440 are coupled to a rename/allocator unit 452 in the execution engine unit 450. In various embodiments, a micro-op cache such as 433 may also or instead be referred to as an op-cache.

The execution engine unit 450 includes the rename/allocator unit 452 coupled to a retirement unit 454 and a set of one or more scheduler unit(s) 456. The scheduler unit(s) 456 represents any number of different schedulers, including reservations stations, central instruction window, etc. The scheduler unit(s) 456 is coupled to the physical register file(s) unit(s) 458. Each of the physical register file(s) units 458 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 458 comprises a vector registers unit, a write mask registers unit, and a scalar registers unit. These register units may provide architectural vector registers, vector mask registers, and general-purpose registers. The physical register file(s) unit(s) 458 is overlapped by the retirement unit 454 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 454 and the physical register file(s) unit(s) 458 are coupled to the execution cluster(s) 460. The execution cluster(s) 460 includes a set of one or more execution units 462 and a set of one or more memory access units 464. The execution units 462 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 456, physical register file(s) unit(s) 458, and execution cluster(s) 460 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 464). It should also be understood that where separate pipelines are used, one or more of these pipelines may be out-of-order issue/execution and the rest in-order.

The set of memory access units 464 is coupled to the memory unit 470, which includes a data TLB unit 472 coupled to a data cache unit 474 coupled to a level 2 (L2) cache unit 476. In one exemplary embodiment, the memory access units 464 may include a load unit, a store address unit, and a store data unit, each of which is coupled to the data TLB unit 472 in the memory unit 470. The instruction cache unit 434 is further coupled to a level 2 (L2) cache unit 476 in the memory unit 470. The L2 cache unit 476 is coupled to one or more other levels of cache and eventually to a main memory.

By way of example, the exemplary register renaming, out-of-order issue/execution core architecture may implement the pipeline 400 as follows: 1) the instruction fetch 438 performs the fetch and length decoding stages 402 and 404; 2) the decode unit 440 performs the decode stage 406; 3) the rename/allocator unit 452 performs the allocation stage 408 and renaming stage 410; 4) the scheduler unit(s) 456 performs the schedule stage 412; 5) the physical register file(s) unit(s) 458 and the memory unit 470 perform the register read/memory read stage 414; the execution cluster 460 perform the execute stage 416; 6) the memory unit 470 and the physical register file(s) unit(s) 458 perform the write back/memory write stage 418; 7) various units may be involved in the exception handling stage 422; and 8) the retirement unit 454 and the physical register file(s) unit(s) 458 perform the commit stage 424.

The core 490 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 490 includes logic to support a packed data instruction set extension (e.g., AVX, AVX2, AVX-512), thereby allowing the operations used by many multimedia applications to be performed using packed data.

It should be understood that the core may support multithreading (executing two or more parallel sets of operations or threads), and may do so in a variety of ways including time sliced multithreading, SMT (e.g., a single physical core provides a logical core for each of the threads that physical core is simultaneously multithreading), or a combination thereof (e.g., time sliced fetching and decoding and SMT thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 434/474 and a shared L2 cache unit 476, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary Core Architecture

Figure 5B:
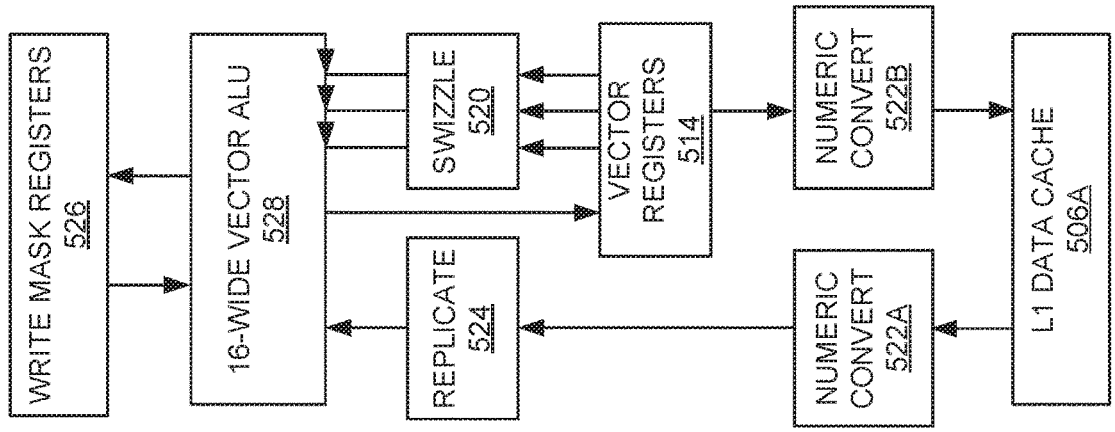
FIGS. 5A-B illustrate a block diagram of a more specific exemplary core architecture, which core would be one of several logic blocks (including other cores of the same type and/or different types) in a chip.
Figure 5A:
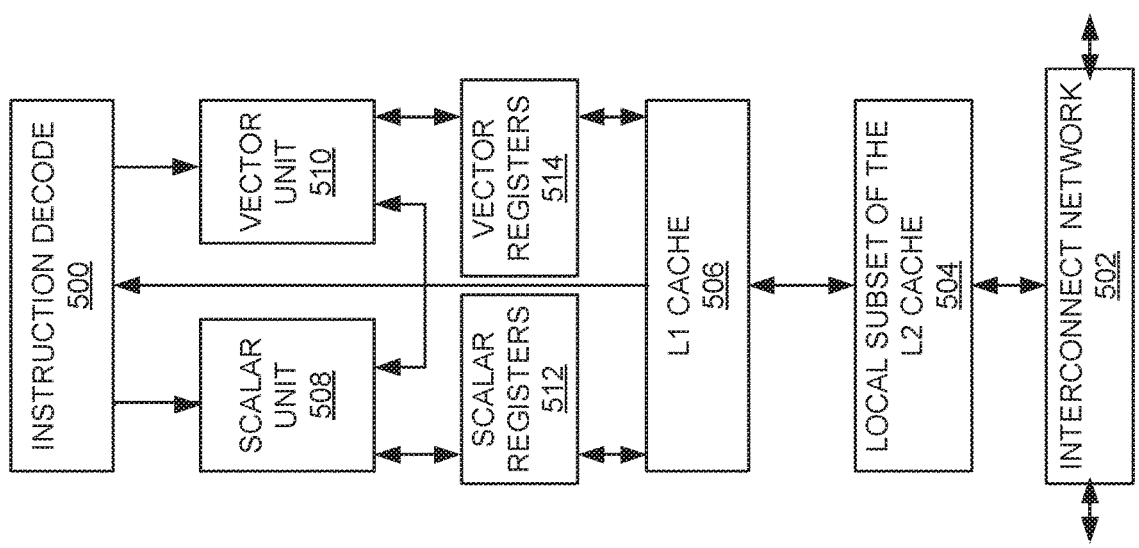

FIGS. 5A-B illustrate a block diagram of a more specific exemplary core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 5A is a block diagram of a single processor core, along with its connection to the on-die interconnect network 502 and with its local subset of the Level 2 (L2) cache 504, according to embodiments of the invention. In one embodiment, an instruction decoder 500 supports the x86 instruction set with a packed data instruction set extension. An L1 cache 506 allows low-latency accesses to cache memory into the scalar and vector units. While in one embodiment (to simplify the design), a scalar unit 508 and a vector unit 510 use separate register sets (respectively, scalar registers 512 and vector registers 514) and data transferred between them is written to memory and then read back in from a level 1 (L1) cache 506, alternative embodiments of the invention may use a different approach (e.g., use a single register set or include a communication path that allow data to be transferred between the two register files without being written and read back).

The local subset of the L2 cache 504 is part of a global L2 cache that is divided into separate local subsets, one per processor core. Each processor core has a direct access path to its own local subset of the L2 cache 504. Data read by a processor core is stored in its L2 cache subset 504 and can be accessed quickly, in parallel with other processor cores accessing their own local L2 cache subsets. Data written by a processor core is stored in its own L2 cache subset 504 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 5B is an expanded view of part of the processor core in FIG. 5A according to embodiments of the invention. FIG. 5B includes an L1 data cache 506A part of the L1 cache 504, as well as more detail regarding the vector unit 510 and the vector registers 514. Specifically, the vector unit 510 is a 16-wide vector processing unit (VPU) (see the 16-wide ALU 528), which executes one or more of integer, single-precision float, and double-precision float instructions. The VPU supports swizzling the register inputs with swizzle unit 520, numeric conversion with numeric convert units 522A-B, and replication with replication unit 524 on the memory input. Write mask registers 526 allow predicating resulting vector writes.

Specific Processor Architectures

Figure 6:
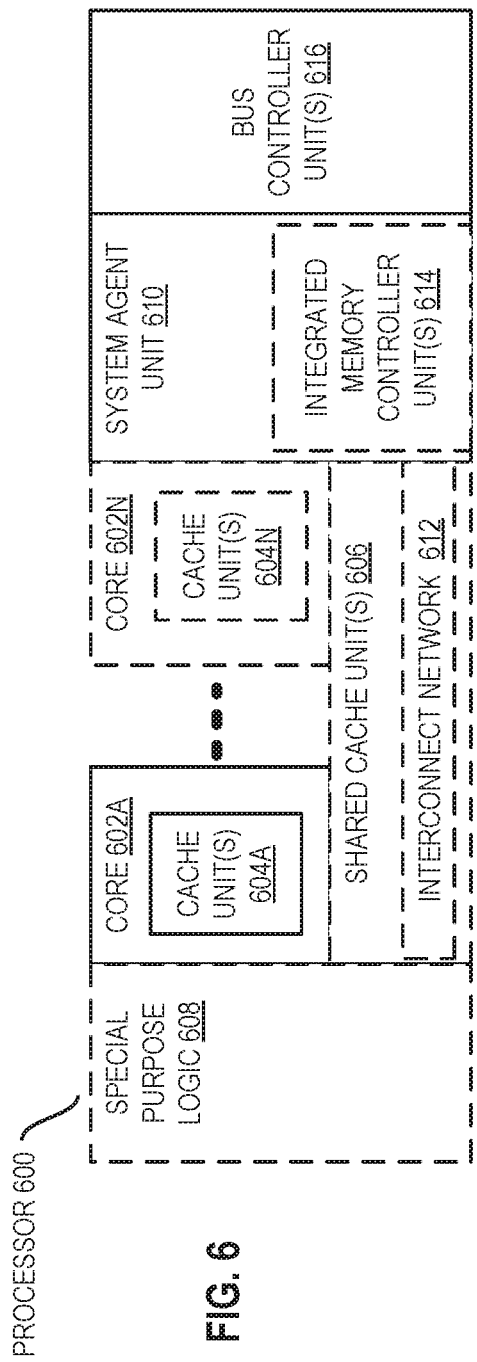
FIG. 6 is a block diagram of a processor 600 that may have more than one core, may have an integrated memory controller, and may have integrated graphics according to embodiments of the invention.

FIG. 6 is a block diagram of a processor 600 that may have more than one core, may have an integrated memory controller, and may have integrated graphics according to embodiments of the invention. The solid lined boxes in FIG. 6 illustrate a processor 600 with a single core 602A, a system agent 610, a set of one or more bus controller units 616, while the optional addition of the dashed lined boxes illustrates an alternative processor 600 with multiple cores 602A-N, a set of one or more integrated memory controller unit(s) 614 in the system agent unit 610, and special purpose logic 608.

Thus, different implementations of the processor 600 may include: 1) a CPU with the special purpose logic 608 being integrated graphics and/or scientific (throughput) logic (which may include one or more cores), and the cores 602A-N being one or more general purpose cores (e.g., general purpose in-order cores, general purpose out-of-order cores, a combination of the two); 2) a coprocessor with the cores 602A-N being a large number of special purpose cores intended primarily for graphics and/or scientific (throughput); and 3) a coprocessor with the cores 602A-N being a large number of general purpose in-order cores. Thus, the processor 600 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 600 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 606, and external memory (not shown) coupled to the set of integrated memory controller units 614. The set of shared cache units 606 may include one or more mid-level caches, such as level 2 (L2), level 3 (L3), level 4 (L4), or other levels of cache, a last level cache (LLC), and/or combinations thereof. While in one embodiment a ring based interconnect unit 612 interconnects the integrated graphics logic 608 (integrated graphics logic 608 is an example of and is also referred to herein as special purpose logic), the set of shared cache units 606, and the system agent unit 610/integrated memory controller unit(s) 614, alternative embodiments may use any number of well-known techniques for interconnecting such units. In one embodiment, coherency is maintained between one or more cache units 606 and cores 602-A-N.

In some embodiments, one or more of the cores 602A-N are capable of multithreading. The system agent 610 includes those components coordinating and operating cores 602A-N. The system agent unit 610 may include for example a power control unit (PCU) and a display unit. The PCU may be or include logic and components needed for regulating the power state of the cores 602A-N and the integrated graphics logic 608. The display unit is for driving one or more externally connected displays.

The cores 602A-N may be homogenous or heterogeneous in terms of architecture instruction set; that is, two or more of the cores 602A-N may be capable of execution the same instruction set, while others may be capable of executing only a subset of that instruction set or a different instruction set.

Exemplary Computer Architectures

FIGS. 7-10 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 7:
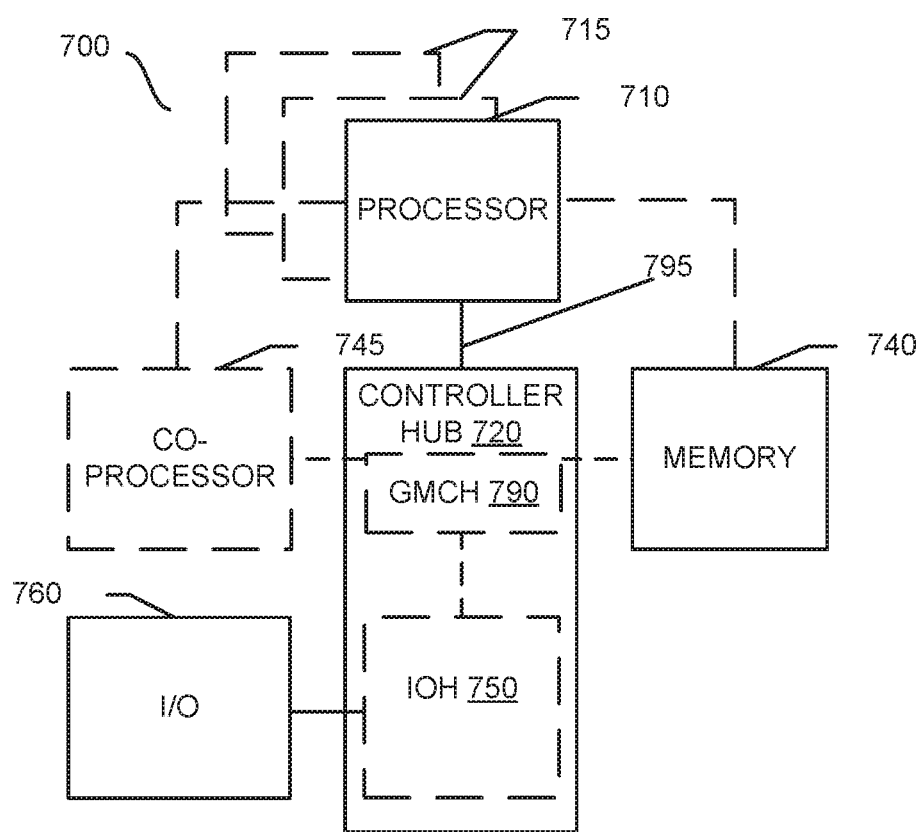
FIGS. 7-10 are block diagrams of exemplary computer architectures.

Referring now to FIG. 7, shown is a block diagram of a system 700 in accordance with one embodiment of the present invention. The system 700 may include one or more processors 710, 715, which are coupled to a controller hub 720. In one embodiment, the controller hub 720 includes a graphics memory controller hub (GMCH) 790 and an Input/Output Hub (IOH) 750 (which may be on separate chips); the GMCH 790 includes memory and graphics controllers to which are coupled memory 740 and a coprocessor 745; the IOH 750 couples input/output (I/O) devices 760 to the GMCH 790. Alternatively, one or both of the memory and graphics controllers are integrated within the processor (as described herein), the memory 740 and the coprocessor 745 are coupled directly to the processor 710, and the controller hub 720 in a single chip with the IOH 750.

The optional nature of additional processors 715 is denoted in FIG. 7 with broken lines. Each processor 710, 715 may include one or more of the processing cores described herein and may be some version of the processor 600.

The memory 740 may be, for example, dynamic random access memory (DRAM), phase change memory (PCM), or a combination of the two. For at least one embodiment, the controller hub 720 communicates with the processor(s) 710, 715 via a multi-drop bus, such as a front-side bus (FSB), point-to-point interface such as QuickPath Interconnect (QPI), or similar connection 795.

In one embodiment, the coprocessor 745 is a special-purpose processor, such as, for example, a high-throughput MIC processor, a network or communication processor, compression engine, graphics processor, GPGPU, embedded processor, or the like. In one embodiment, controller hub 720 may include an integrated graphics accelerator.

There can be a variety of differences between the physical resources 710, 715 in terms of a spectrum of metrics of merit including architectural, microarchitectural, thermal, power consumption characteristics, and the like.

In one embodiment, the processor 710 executes instructions that control data processing operations of a general type. Embedded within the instructions may be coprocessor instructions. The processor 710 recognizes these coprocessor instructions as being of a type that should be executed by the attached coprocessor 745. Accordingly, the processor 710 issues these coprocessor instructions (or control signals representing coprocessor instructions) on a coprocessor bus or other interconnect, to coprocessor 745. Coprocessor(s) 745 accept and execute the received coprocessor instructions.

Figure 8:
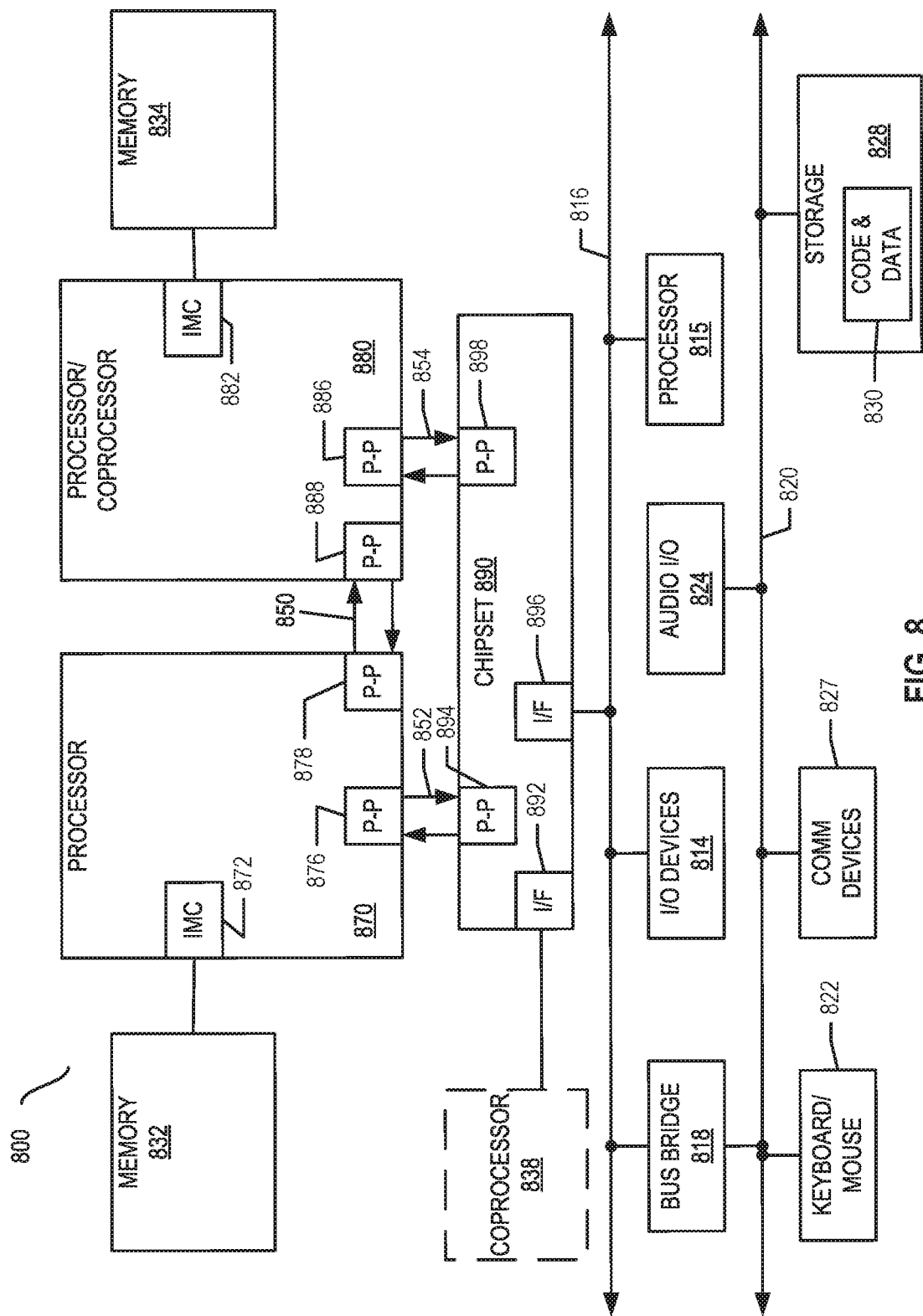

Referring now to FIG. 8, shown is a block diagram of a first more specific exemplary system 800 in accordance with an embodiment of the present invention. As shown in FIG. 8, multiprocessor system 800 is a point-to-point interconnect system, and includes a first processor 870 and a second processor 880 coupled via a point-to-point interconnect 850. Each of processors 870 and 880 may be some version of the processor 600. In one embodiment of the invention, processors 870 and 880 are respectively processors 710 and 715, while coprocessor 838 is coprocessor 745. In another embodiment, processors 870 and 880 are respectively processor 710 coprocessor 745.

Processors 870 and 880 are shown including integrated memory controller (IMC) units 872 and 882, respectively. Processor 870 also includes as part of its bus controller unit's point-to-point (P-P) interfaces 876 and 878; similarly, second processor 880 includes P-P interfaces 886 and 888. Processors 870, 880 may exchange information via a point-to-point (P-P) interface 850 using P-P interface circuits 878, 888. As shown in FIG. 8, IMCs 872 and 882 couple the processors to respective memories, namely a memory 832 and a memory 834, which may be portions of main memory locally attached to the respective processors.

Processors 870, 880 may each exchange information with a chipset 890 via individual P-P interfaces 852, 854 using point to point interface circuits 876, 894, 886, 898. Chipset 890 may optionally exchange information with the coprocessor 838 via a high-performance interface 892. In one embodiment, the coprocessor 838 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 890 may be coupled to a first bus 816 via an interface 896. In one embodiment, first bus 816 may be a Peripheral Component Interconnect (PCI) bus, or a bus such as a PCI Express bus or another third generation I/O interconnect bus, although the scope of the present invention is not so limited.

As shown in FIG. 8, various I/O devices 814 may be coupled to first bus 816, along with a bus bridge 818 which couples first bus 816 to a second bus 820. In one embodiment, one or more additional processor(s) 815, such as coprocessors, high-throughput MIC processors, GPGPU's, accelerators (such as, e.g., graphics accelerators or digital signal processing (DSP) units), field programmable gate arrays, or any other processor, are coupled to first bus 816. In one embodiment, second bus 820 may be a low pin count (LPC) bus. Various devices may be coupled to a second bus 820 including, for example, a keyboard and/or mouse 822, communication devices 827 and a storage unit 828 such as a disk drive or other mass storage device which may include instructions/code and data 830, in one embodiment. Further, an audio I/O 824 may be coupled to the second bus 820. Note that other architectures are possible. For example, instead of the point-to-point architecture of FIG. 8, a system may implement a multi-drop bus or other such architecture.

Figure 9:
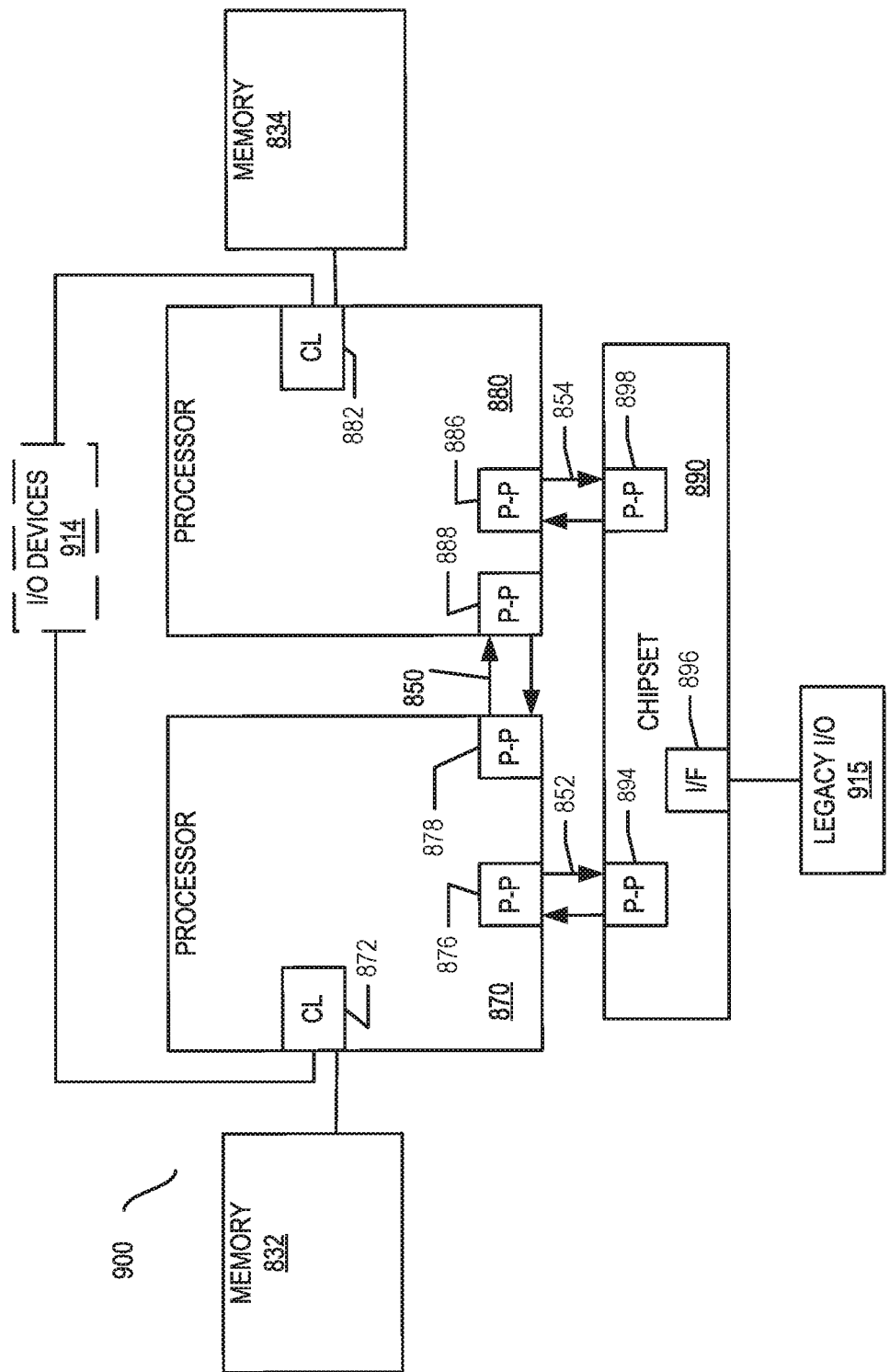

Referring now to FIG. 9, shown is a block diagram of a second more specific exemplary system 900 in accordance with an embodiment of the present invention. Like elements in FIGS. 8 and 9 bear like reference numerals, and certain aspects of FIG. 8 have been omitted from FIG. 9 in order to avoid obscuring other aspects of FIG. 9.

FIG. 9 illustrates that the processors 870, 880 may include integrated memory and I/O control logic ("CL") 872 and 882, respectively. Thus, the CL 872, 882 include integrated memory controller units and include I/O control logic. FIG. 9 illustrates that not only are the memories 832, 834 coupled to the CL 872, 882, but also that I/O devices 914 are also coupled to the control logic 872, 882. Legacy I/O devices 915 are coupled to the chipset 890.

Figure 10:
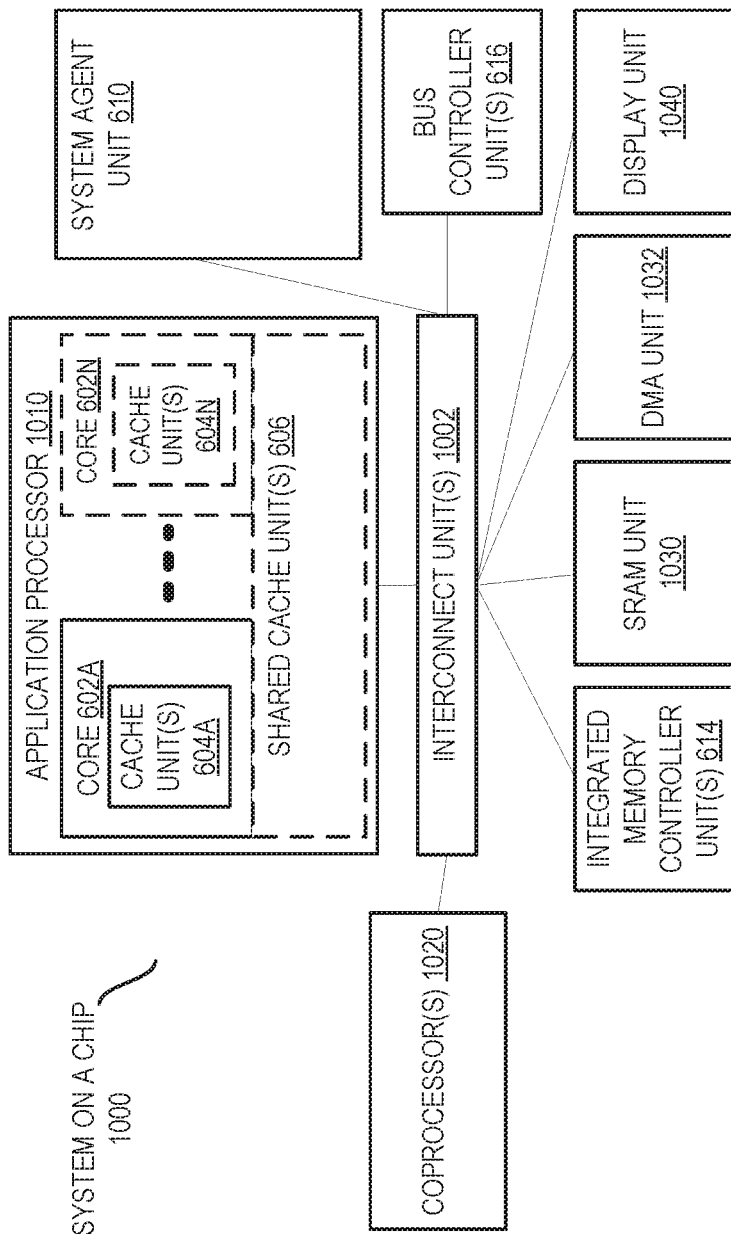

Referring now to FIG. 10, shown is a block diagram of a SoC 1000 in accordance with an embodiment of the present invention. Similar elements in FIG. 6 bear like reference numerals. Also, dashed lined boxes are optional features on more advanced SoCs. In FIG. 10, an interconnect unit(s) 1002 is coupled to: an application processor 1010 which includes a set of one or more cores 602A-N, which include cache units 604A-N, and shared cache unit(s) 606; a system agent unit 610; a bus controller unit(s) 616; an integrated memory controller unit(s) 614; a set or one or more coprocessors 1020 which may include integrated graphics logic, an image processor, an audio processor, and a video processor; an static random access memory (SRAM) unit 1030; a direct memory access (DMA) unit 1032; and a display unit 1040 for coupling to one or more external displays. In one embodiment, the coprocessor(s) 1020 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 830 illustrated in FIG. 8, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object-oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 11:
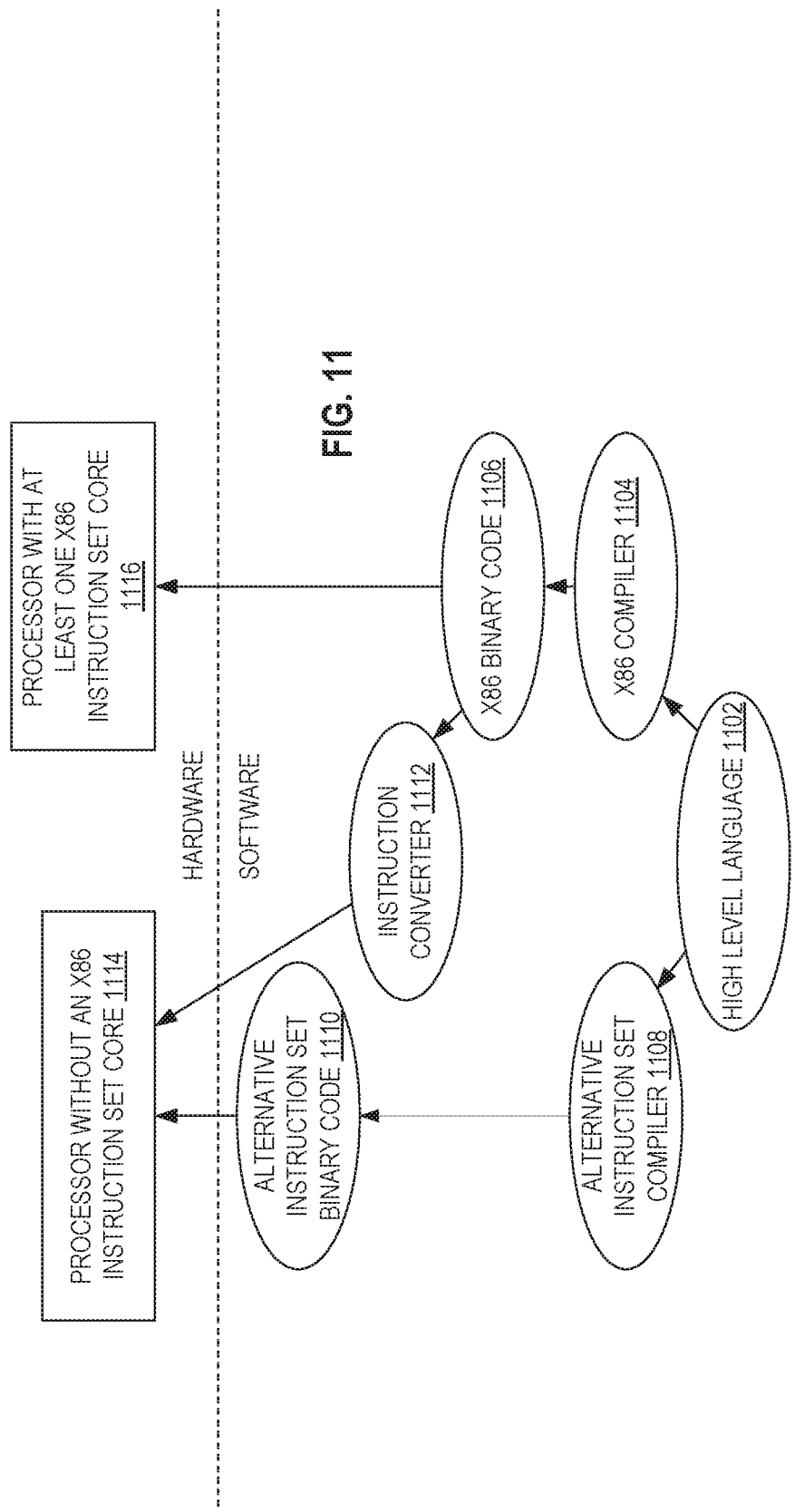
FIG. 11 is a block diagram contrasting the use of a software instruction converter to convert binary instructions in a source instruction set to binary instructions in a target instruction set according to embodiments of the invention.

FIG. 11 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 11 shows a program in a high-level language 1102 may be compiled using an x86 compiler 1104 to generate x86 binary code 1106 that may be natively executed by a processor with at least one x86 instruction set core 1116. The processor with at least one x86 instruction set core 1116 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1104 represents a compiler that is operable to generate x86 binary code 1106 (e.g., object code) that can, with or without additional linkage processing, be executed on the processor with at least one x86 instruction set core 1116. Similarly, FIG. 11 shows the program in the high-level language 1102 may be compiled using an alternative instruction set compiler 1108 to generate alternative instruction set binary code 1110 that may be natively executed by a processor without at least one x86 instruction set core 1114 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1112 is used to convert the x86 binary code 1106 into code that may be natively executed by the processor without an x86 instruction set core 1114. This converted code is not likely to be the same as the alternative instruction set binary code 1110 because an instruction converter capable of this is difficult to make; however, the converted code will accomplish the general operation and be made up of instructions from the alternative instruction set. Thus, the instruction converter 1112 represents software, firmware, hardware, or a combination thereof that, through emulation, simulation or any other process, allows a processor or other electronic device that does not have an x86 instruction set processor or core to execute the x86 binary code 1106.

Converting a Floating-Point Value from Half Precision to Single Precision

Figure 12:
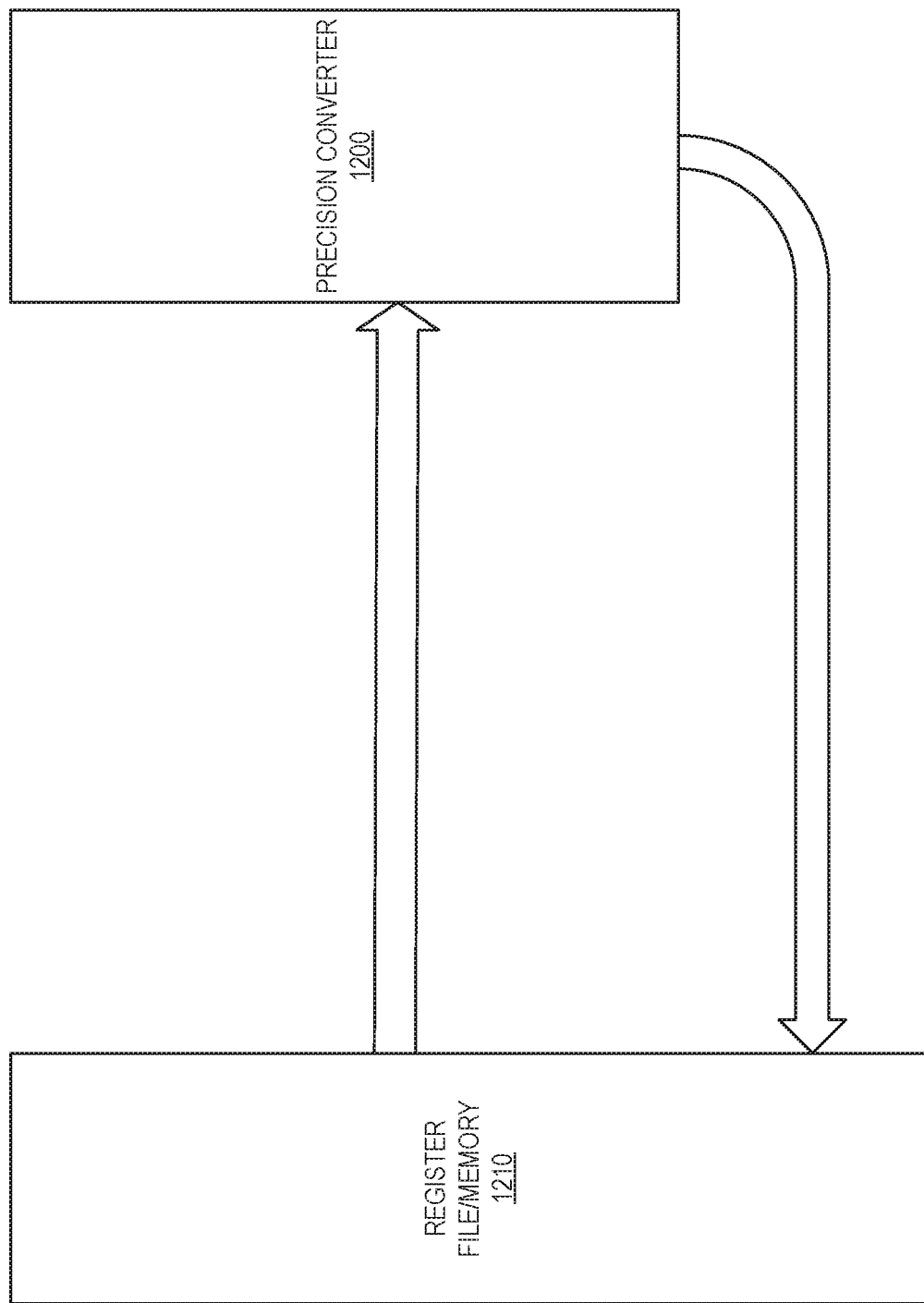
FIG. 12 is a block diagram of an apparatus for converting a floating-point value from half precision to single precision according to an embodiment of the invention.

Embodiments of the invention may use the apparatus shown in FIG. 12 to convert a floating-point value from half precision to single precision. The apparatus of FIG. 12 may be included in a processor and/or system of FIGS. 4 to 10, each as described above, which illustrate processors and systems including embodiments of the invention, in which processors 490, 600, 710, 715, 870, 880, and 1010 and systems 700, 800, 900, and 1000 may include any or all of the blocks and/or elements shown in FIG. 12, which may operate according to the techniques and/or method described in the descriptions of FIG. 13.

Embodiments of the invention use the architecture shown in FIG. 12 to convert a floating-point value from half-precision to single-precision. The described embodiments perform operations on 16-bit half-precision floating-point values in 128-bit, 256-bit, and 512-bit packed data registers and memory locations. For example, one embodiment converts sixteen packed half-precision floating-point data values in zmm2/m512, where the sixteen packed half-precision floating-point values are stored in the lower 16 bits of each 32-bit word, and stores four resulting packed single-precision floating-point data values in zmm1. However, other embodiments may perform operations on other sizes and/or data types.

In an embodiment illustrated in FIG. 12, processing hardware including precision converter 1200 converts a floating-point value stored in a source location in register file/memory 1210 from half-precision to single-precision and stores the resulting floating-point value in a destination location in register file/memory 1210. An embodiment uses processing hardware to perform conversion of packed data values in response to decoding a single instruction, identified herein with the mnemonic VCVTPH2PS. In various embodiment, a VCVTPH2PS instruction may provide for optional write-masking, broadcasting, and/or zeroing.

In an embodiment, the format of a VCVTPH2PS instruction may include a broadcast field, whose content distinguishes whether or not a broadcast type data manipulation operation is to be performed. If the content of the broadcast field indicates that a broadcast type data manipulation is to be performed, the broadcast may be performed by converting, from half-precision to single-precision, the floating-point value stored in the lowest element of the source memory location and storing the result in each element of the destination register.

Figure 13:
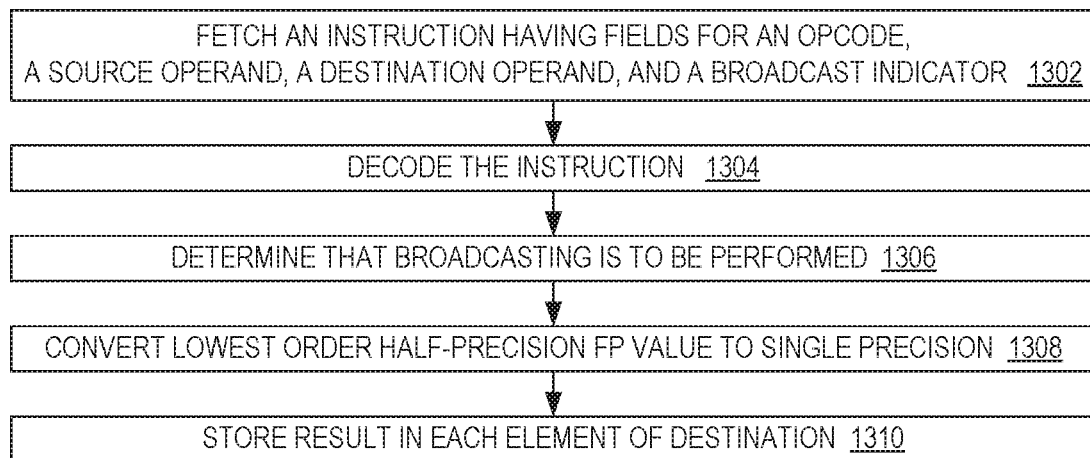
FIG. 13 is a flow diagram of a method for converting a floating-point value from half precision to single precision according to an embodiment of the invention.

A method according to an embodiment of the invention is illustrated in FIG. 13. The method may be implemented within the context of the processor architectures described herein, but is not limited to any particular processor architecture.

In 1302, a first instruction (e.g., VCVTPH2PS) is fetched, the instruction having fields to specify an opcode, a source operand, a destination operand, and a broadcast indicator. In an embodiment, the first source operand field is to specify a 512-bit memory location storing sixteen packed half-precision floating-point data values, where the sixteen packed half-precision floating-point values are stored in the lower 16 bits of each 32-bit word, and the destination operand is to specify a 512-bit packed data register in which to store sixteen packed single-precision floating-point values.

In 1304, the first instruction is decoded. In 1306, it is determined that the broadcast indicator indicates that a broadcast type data manipulation is to be performed.

In 1308, the half-precision floating-point value stored in the lowest sixteen bits of the source memory location is converted to a single-precision floating-point value. In 1310, the resulting single-precision floating-point value is stored in each 32-bit element of the destination register.

In other embodiments, the source and destination operand fields may specify 128-bit or 256-bit registers or memory locations.

In an embodiment, the ISA of a processor may include a first single instruction (e.g., VCVTPH2PS) to convert half-precision floating-point values to single-precision floating-point values as one of a subset of instructions (referred to herein as FP16 instructions) to operate on half-precision floating-point values (the operations referred to herein as FP16 operations). In an embodiment, the execution of FP16 instructions, such as VCVTPH2PS, and FP16 operations may be controlled based on or otherwise depend on the content of an FP16 control and status register.

Figure 14A:
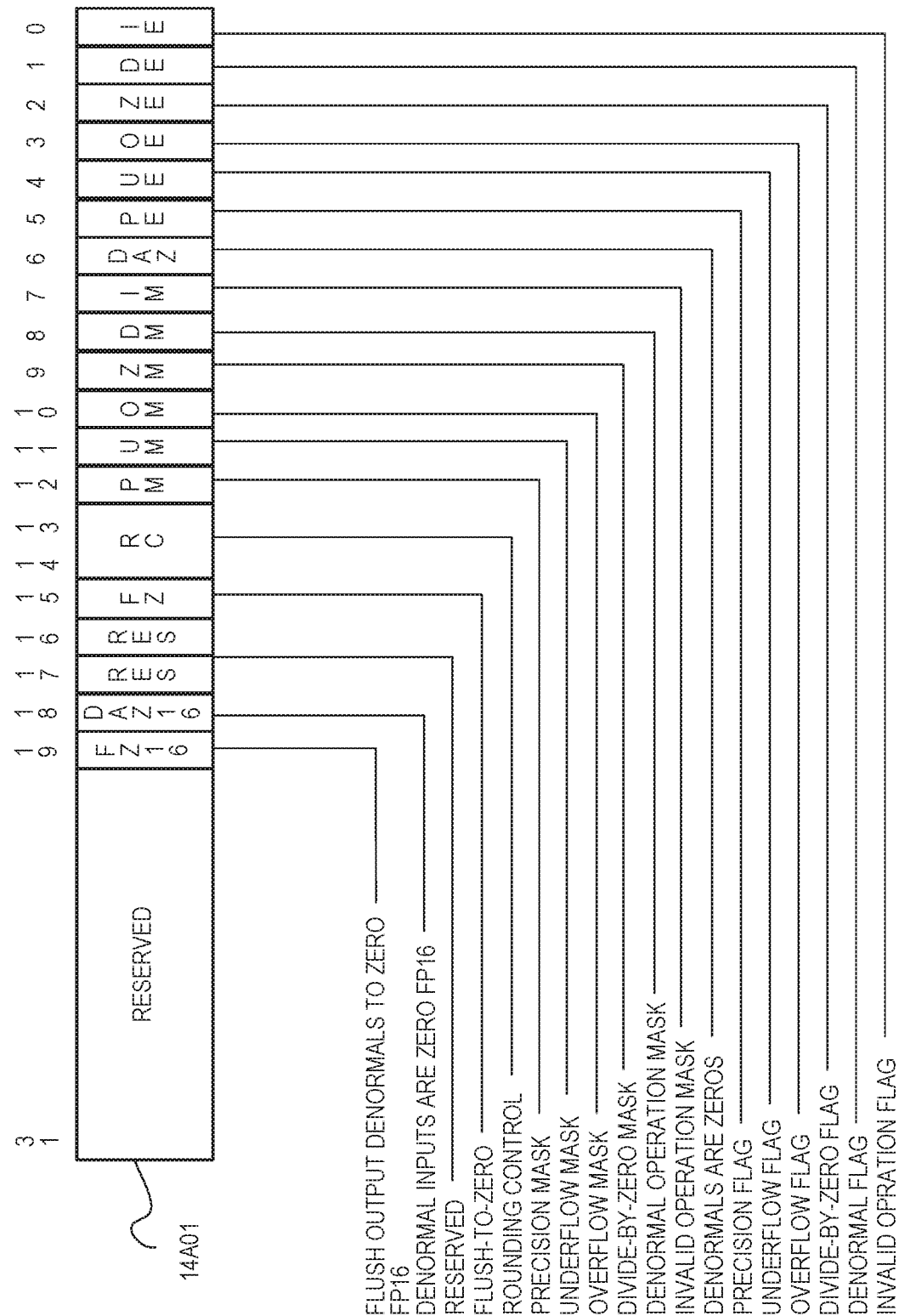

FIG. 14A illustrates an embodiment of an FP16 control and status register having fields related to half-precision floating-point usage for an instruction. As shown, two bits (fields) of the control and status register 14A01 are used to control denormal number handling for FP16 operations. Bit 18, denormals-are-zero FP16 (DAZ16), when set, indicates that input FP16 denormal elements of operands are to be treated as zero for computations (denormals-as-zero mode for FP16). For example, each denormal input element is set to zero before the operation of the instruction is performed. In some embodiments, the zeroed elements have the same sign as the denormal input.

The denormals-are-zeros FP16 mode is not compatible with the IEEE Standard 754. However, the denormals-are-zeros FP16 mode improves processor performance for applications such as streaming media processing, where rounding a denormal operand to zero does not appreciably affect the quality of the processed data.

Bit 19, FZ16, when set, indicates that output FP16 denormal element results are flushed to zero (flush-to-zeros mode for FP16). For example, underflow results are set to zero after the operation of the instruction is performed.

Typically, when an instruction uses an FP16 value in a source operand DAZ16 is used and when an instruction produces an FP16 output FZ16 is used. Note that both bits may be used in some embodiments.

Several other bits of the control and status register may be used for other operations. For example, bits 0 through 5 indicate exceptions that have been detected (e.g., precision, underflow, overflow, divide-by-zero, denormal, and invalid operation). Bits 7 through 12 provide mask bits for exception types (e.g., invalid operation mask, denormal operation mask, divide-by-zero mask, overflow mask, underflow mask, and precision mask). Bits 13 and 14 control how results of floating-point instructions are rounded. Bits 6 and 15 enable denormals-are-zeros and flush-to-zeros mode for non-FP16 data.

When one or more floating-point exception conditions are detected, the processor sets the appropriate flag bits, then takes one of two possible courses of action, depending on the settings of the corresponding mask bits: 1) mask bit set—the processor handles the exception automatically, producing a predefined (and often times usable) result, while allowing program execution to continue undisturbed; and 2) mask bit clear—the processor invokes a software exception handler to handle the exception.

FIG. 14B illustrates an embodiment of an FP16 control and status register having fields related to half-precision floating-point usage for an instruction. As shown, two bits of the control and status register 14B01 are used to control denormal number handling for FP16 operations. Bit 19, denormals-are-zero FP16 (DAZ16), when set, indicates that input FP16 denormal elements of operands are to be treated as zero for computations (denormals-as-zero mode for FP16). For example, each denormal input element is set to zero before the operation of the instruction is performed. In some embodiments, the zeroed elements have the same sign as the denormal input.

The denormals-are-zeros FP16 mode is not compatible with the IEEE Standard 754. However, the denormals-are-zeros FP16 mode improves processor performance for applications such as streaming media processing, where rounding a denormal operand to zero does not appreciably affect the quality of the processed data.

Bit 18, FZ16, when set, indicates that output FP16 denormal element results are flushed to zero (flush-to-zeros mode for FP16). For example, underflow results are set to zero after the operation of the instruction is performed.

Typically, when an instruction uses an FP16 value in a source operand DAZ16 is used and when an instruction produces an FP16 output FZ16 is used. Note that both bits may be used in some embodiments.

Several other bits of the control and status register may be used for other operations. For example, bits 0 through 5 indicate exceptions that have been detected (e.g., precision, underflow, overflow, divide-by-zero, denormal, and invalid operation). Bits 7 through 12 provide mask bits for exception types (e.g., invalid operation mask, denormal operation mask, divide-by-zero mask, overflow mask, underflow mask, and precision mask). Bits 13 and 14 control how results of floating-point instructions are rounded. Bits 6 and 15 enable denormals-are-zeros and flush-to-zeros mode for non-FP16 data.

When one or more floating-point exception conditions are detected, the processor sets the appropriate flag bits, then takes one of two possible courses of action, depending on the settings of the corresponding mask bits: 1) mask bit set—the processor handles the exception automatically, producing a predefined (and often times usable) result, while allowing program execution to continue undisturbed; and 2) mask bit clear—the processor invokes a software exception handler to handle the exception.

Operations in flow diagrams may have been described with reference to exemplary embodiments of other figures. However, it should be understood that the operations of the flow diagrams may be performed by embodiments of the invention other than those discussed with reference to other figures, and the embodiments of the invention discussed with reference to other figures may perform operations different than those discussed with reference to flow diagrams. Furthermore, while the flow diagrams in the figures show a particular order of operations performed by certain embodiments of the invention, it should be understood that such order is exemplary (e.g., alternative embodiments may perform the operations in a different order, combine certain operations, overlap certain operations, etc.).

Accordingly, the invention may be embodied in machine-executable instructions which may be used to cause a general-purpose or special-purpose processor to perform operations. Alternatively, these operations may be performed by specific hardware components that contain hard-wired logic for performing the operations, or by any combination of programmed computer components and custom hardware components.

Thus, one or more parts of embodiments of the invention may be implemented using different combinations of software, firmware, and/or hardware. Embodiments may be implemented using an electronic device that stores and transmits (internally and/or with other electronic devices over a network) code (which is composed of software instructions and which is sometimes referred to as computer program code or a computer program) and/or data using machine-readable media (also called computer-readable media), such as machine-readable storage media (e.g., magnetic disks, optical disks, read only memory (ROM), flash memory devices, phase change memory) and machine-readable transmission media (also called a carrier) (e.g., electrical, optical, radio, acoustical or other form of propagated signals—such as carrier waves, infrared signals). Thus, an electronic device (e.g., a computer) may include hardware and software, such as a set of one or more processors coupled to one or more machine-readable storage media to store code for execution on the set of processors and/or to store data. For instance, an electronic device may include non-volatile memory containing the code since the non-volatile memory may persist code/data even when the electronic device is turned off (when power is removed), and while the electronic device is turned on that part of the code that is to be executed by the processor(s) of that electronic device is typically copied from the slower non-volatile memory into volatile memory (e.g., dynamic random access memory (DRAM), static random access memory (SRAM)) of that electronic device. Typical electronic devices also include a set or one or more physical network interface(s) to establish network connections (to transmit and/or receive code and/or data using propagating signals) with other electronic devices.

An embodiment of the invention is a processor including execution circuitry to, in response to a decoded instruction, convert a half-precision floating-point value to a single-precision floating-point value and store the single-precision floating-point value in each of the plurality of element locations of a destination register. The processor also includes a decoder and the destination register. The decoder is to decode an instruction to generate the decoded instruction.

The first instruction may include a first field to specify a source location from which the half-precision floating-point value is to be received. The source location may be a location in a system memory. The processor may include a source register, wherein the source location is the source register. The half-precision floating-point value may be one of a first set of half-precision floating-point values to be represented by a first vector to be stored in the first source location. The half-precision floating-point value may be stored in a lowest element location of the source location. The instruction may include a second field to provide a broadcast indicator. Execution of the first decoded instruction may include, in response to determining that the broadcast indicator is set, storing the single-precision floating-point value in each of the plurality of element locations of the destination register. Execution of the first decoded instruction may include, in response to determining that the broadcast indicator is not set, converting each of a plurality of half-precision floating-point values to single-precision floating-point values and storing each of the single-precision floating-point value in each of the plurality of element locations of the destination register.

An embodiment of the invention is a system including the processor and a system memory. The system memory may provide the half-precision floating-point value.

In an embodiment, a method may include decoding a first instruction to generate a first decoded instruction; determining that a broadcast indicator is set; converting, in response to the first decoded instruction, a half-precision floating-point value to a single-precision floating-point value; and storing the single-precision floating-point value in each of the plurality of element locations of a destination register.

The first instruction may include a first field to specify a source location from which the half-precision floating-point value is to be received. The source location may be a location in a system memory. The source location may be a source register. The half-precision floating-point value may be one of a first set of half-precision floating-point values to be represented by a first vector to be stored in the first source location. The half-precision floating-point value may be to be stored in a lowest element location of the source location. The instruction is to include a second field to provide the broadcast indicator.

In an embodiment, an apparatus may include means for performing any of the methods described above. In an embodiment, a machine-readable tangible medium may store instructions, which, when executed by a machine, cause the machine to perform any of the methods described above.

Although the invention has been described in terms of several embodiments, the invention is not limited to the embodiments described, and it may be practiced with various changes without departing from the spirit and scope of the invention as set forth the appended claims. Accordingly, the specification and drawing are to be regarded as illustrative rather than limiting.

What is claimed is:

1. A processor comprising:
a decoder to decode a first instruction to generate a first decoded instruction, wherein a format of the first instruction is to include a broadcast, and wherein the first instruction format includes a second field to specify a source location from which the half-precision floating-point value is to be received, and wherein the half-precision floating-point value is one of a first set of half-precision floating-point values to be represented by a first vector to be stored in the first source location;
a destination register having a plurality of element locations;
execution circuitry to execute the first decoded instruction, wherein execution of the first decoded instruction is to include, in response to determining that the broadcast bit is set, converting a half-precision floating-point value to a single-precision floating-point value and storing the single-precision floating-point value in each of the plurality of element locations of the destination register, and wherein execution of the first decoded instruction is also to include, in response to determining that the broadcast bit is not set, converting each of a plurality of half-precision floating-point values to single-precision floating-point values and storing each of the single-precision floating-point values in each of the plurality of element locations of the destination register.

2. The processor of claim 1, wherein the source location is a location in a system memory.

3. The processor of claim 1, further comprising a source register, wherein the source location is the source register.

4. The processor of claim 1, wherein the half-precision floating-point value is to be stored in a lowest element location of the source location.

5. A method comprising:
decoding a first instruction to generate a first decoded instruction, wherein the first instruction has first instruction formation including a broadcast bit, wherein a first instruction format includes a first field to specify a source location from which the half-precision floating-point value is to be received, and wherein the half-precision floating-point value is one of a first set of half-precision floating-point values to be represented by a first vector to be stored in the first source location;
determining whether the broadcast bit is set;
converting, in response to the first decoded instruction and determining that the broadcast indicator is set, a half-precision floating-point value to a single-precision floating-point value storing the single-precision floating-point value in each of the plurality of element locations of a destination register, or converting, in response to determining that the broadcast indicator is not set, each of a plurality of half-precision floating-point values to single-precision floating-point values and storing each of the single-precision floating-point value in each of the plurality of element locations of the destination register.

6. The method of claim 5, wherein the source location is a location in a system memory.

7. The method of claim 5, wherein the source location is a source register.

8. The method of claim 5, wherein the half-precision floating-point value is to be stored in a lowest element location of the source location.

9. A non-transitory machine-readable medium having program code stored thereon which, when executed by a machine, causes the machine to perform the operations of:
decoding a first instruction to generate a first decoded instruction, wherein the first instruction has first instruction formation including a broadcast bit, wherein a first instruction format includes a first field to specify a source location from which the half-precision floating-point value is to be received, and wherein the half-precision floating-point value is one of a first set of half-precision floating-point values to be represented by a first vector to be stored in the first source location;
determining whether the broadcast bit is set;
converting, in response to the first decoded instruction and determining that the broadcast indicator is set, a half-precision floating-point value to a single-precision floating-point value storing the single-precision floating-point value in each of the plurality of element locations of a destination register, or converting, in response to determining that the broadcast indicator is not set, each of a plurality of half-precision floating-point values to single-precision floating-point values and storing each of the single-precision floating-point value in each of the plurality of element locations of the destination register.

10. The non-transitory machine-readable medium of claim 9, wherein the source location is a location in a system memory.

11. The non-transitory machine-readable medium of claim 9, wherein the source location is a source register.

12. The non-transitory machine-readable medium of claim 9, wherein the half-precision floating-point value is to be stored in a lowest element location of the source location.

\* \* \* \* \*